(12) United States Patent
El-Ghoroury et al.

(10) Patent No.: US 9,171,970 B2
(45) Date of Patent: *Oct. 27, 2015

(54) ALTERNATING BIAS HOT CARRIER SOLAR CELLS

(71) Applicant: Ostendo Technologies, Inc., Carlsbad, CA (US)

(72) Inventors: Hussein S. El-Ghoroury, Carlsbad, CA (US); Dale A. McNeill, Encinitas, CA (US); Selim E. Guncer, San Diego, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 18 days.

This patent is subject to a terminal disclaimer.

(21) Appl. No.: 14/028,344

(22) Filed: Sep. 16, 2013

(65) Prior Publication Data

US 2014/0083492 A1 Mar. 27, 2014

Related U.S. Application Data

(60) Continuation of application No. 13/245,527, filed on Sep. 26, 2011, now Pat. No. 8,536,444, which is a division of application No. 13/165,590, filed on Jun. 21, 2011, now Pat. No. 8,217,258, which is a continuation-in-part of application No. 12/833,661, filed on Jul. 9, 2010, now abandoned.

(51) Int. Cl.

| | | |
|---|---|---|
| *H01L 31/00* | (2006.01) | |
| *H01L 31/02* | (2006.01) | |
| *B82Y 20/00* | (2011.01) | |
| *B82Y 30/00* | (2011.01) | |
| *H01L 31/028* | (2006.01) | |
| *H01L 31/0296* | (2006.01) | |
| *H01L 31/0304* | (2006.01) | |
| *H01L 31/032* | (2006.01) | |
| *H01L 31/0352* | (2006.01) | |
| *H01L 31/068* | (2012.01) | |
| *H01L 31/042* | (2014.01) | |
| *H02S 40/32* | (2014.01) | |
| *B82Y 99/00* | (2011.01) | |

(52) U.S. Cl.
CPC ........... *H01L 31/02008* (2013.01); *B82Y 20/00* (2013.01); *B82Y 30/00* (2013.01); *H01L 31/028* (2013.01); *H01L 31/02021* (2013.01); *H01L 31/0296* (2013.01); *H01L 31/0304* (2013.01); *H01L 31/0322* (2013.01); *H01L 31/0352* (2013.01); *H01L 31/035236* (2013.01); *H01L 31/042* (2013.01); *H01L 31/068* (2013.01); *H02S 40/32* (2014.12); *B82Y 99/00* (2013.01); *Y02E 10/541* (2013.01); *Y02E 10/544* (2013.01); *Y02E 10/547* (2013.01); *Y10S 977/755* (2013.01); *Y10S 977/774* (2013.01); *Y10S 977/948* (2013.01)

(58) Field of Classification Search
CPC .......... B82Y 5/00; B82Y 30/00; B82Y 20/00; B82Y 10/00; B82Y 99/00; B82Y 40/00; B82Y 15/00; B82Y 25/00; H01L 31/0352; H01L 31/035236; H01L 31/0304; H01L 31/028; H01L 31/0298; H01L 31/02168; H01L 31/0322; H01L 31/068; H01L 31/02008; H01L 31/02021; H01L 31/042; H01L 31/055; H01L 31/075; H01L 31/035227; H01L 31/035281; H01L 31/03529; H01L 31/072; H01L 31/1804; H01L 31/1872; H01L 31/03046; H01L 31/032; H01L 31/035218; H01L 31/06; H01L 31/022425; H01L 31/022466; H01L 31/02966; H01L 31/0328; H01L 31/0384; H01L 31/0543; H01L 31/0547; H01L 51/426; H01L 51/0037; H01L 51/0049; H01L 51/42; H01L 51/4213; H01L 51/4266; H01L 51/035; H01L 51/0036; H01L 51/0055; H01L 51/424; H01L 51/5012; H01L 29/66; H01L 29/86; H01L 29/127; H01L 2924/0002; H01L 2924/00; H01L 28/40; H01L 28/91; H01L 31/1864; H01L 31/02167; H01L 31/0224; H01L 31/022433; H01L 31/022441; H01L 31/02327; H01L 31/0284; H01L 31/0312; H01L 31/0324; H01L 31/035272; H01L 31/04; H01L 31/041; H01L 31/0428; H01L 31/0482; H01L 31/0504; H01L 31/0508; H01L 31/0512; H01L 31/056; H01L 31/065; H01L 31/109;

500

H01L 31/115; H01L 31/18; H01L 31/202; H01L 35/34; H01L 21/304; H01L 2251/301; H01L 2251/306; H01L 2251/308; H01L 23/373; H01L 27/10817; H01L 27/10852; H01L 27/30; H01L 27/301; Y02E 10/547; Y02E 10/544; Y02E 10/541; Y02E 10/549; Y02E 10/50; Y02E 10/52; Y02E 10/548; Y02E 10/46; Y02E 10/40; Y02E 10/465; Y02E 10/542; Y02E 10/72; Y02E 10/41; Y02E 10/44; Y02E 10/45; Y02E 10/543; Y02E 10/58; Y02E 60/145; H01M 14/005; H01M 14/00; H01S 5/04; H01S 5/14; H02S 99/00; H02S 40/32; H02S 10/30; Y02B 90/242; Y02B 90/246; Y02B 10/30; Y02B 10/70

See application file for complete search history.

(56) References Cited

U.S. PATENT DOCUMENTS

| | | | |
|---|---|---|---|
| 4,533,783 | A | 8/1985 | Benjamin et al. |
| 4,577,052 | A | 3/1986 | Schutten et al. |
| 4,791,528 | A | 12/1988 | Suzuki et al. |
| 6,081,017 | A | 6/2000 | Kim et al. |
| 6,365,825 | B1 | 4/2002 | Hayashi et al. |
| 7,465,872 | B1 | 12/2008 | de Rooij et al. |
| 2002/0043278 | A1 | 4/2002 | Hashimoto et al. |
| 2008/0156366 | A1 | 7/2008 | Kim et al. |
| 2009/0086170 | A1 | 4/2009 | El-Ghoroury et al. |
| 2010/0313934 | A1 | 12/2010 | Vaananen |

FOREIGN PATENT DOCUMENTS

| | | |
|---|---|---|
| JP | 2009-059915 | 3/2009 |
| WO | WO-01/47031 | 6/2001 |

OTHER PUBLICATIONS

"Advisory Action Dated Feb. 2, 2012, U.S. Appl. No. 13/165,590", (Feb. 2, 2012).

"Communication Dated Feb. 22, 2013; European Patent Application No. 11731226.4", (Feb. 22, 2013).

"International Search Report and Written Opinion of the International Searching Authority Dated Apr. 27, 2012, International Application No. PCT/US2011/042693", (Apr. 27, 2012).

"Notice of Allowance Dated Mar. 13, 2012, U.S. Appl. No. 13/165,590", (Mar. 13, 2012).

"Notice of Allowance Mailed Mar. 7, 2013; U.S. Appl. No. 13/245,527", (Mar. 7, 2013).

"Office Action Dated Dec. 17, 2012; U.S. Appl. No. 13/245,527", (Dec. 17, 2012).

"Office Action Dated Dec. 19, 2011, U.S. Appl. No. 13/165,590", (Dec. 19, 2011).

"Office Action Dated Jul. 27, 2012; U.S. Appl. No. 13/245,527", (Jul. 27, 2012).

"Office Action Dated Oct. 11, 2011, U.S. Appl. No. 13/165,590", (Oct. 11, 2011).

"Solar Photovoltaics, Expanding Electric Generation Options", Electric Power Research Institute, An EPRI Technology Innovation White Paper, (Dec. 2007), pp. 1-27.

Barnham, K. W., et al., "Quantum well solar cells", *Physica E*, 14, (2002), pp. 27-36.

Bremner, Stephen P., et al., "Detailed Balance Efficiency Limits with Quasi-Fermi Level Variations", *IEEE Transactions on Electron Devices*, vol. 46, No. 10, (Oct. 1999), pp. 1932-1939.

Brown, Gregory F., et al., "Third generation photovoltaics", *Laser & Photonics Reviews*, Rev. 3, No. 4, (Jan. 29, 2009), pp. 394-405.

Conibeer, Gavin, et al., "Progress on hot carrier cells", *Solar Energy Materials & Solar Cells*, vol. 93, No. 6-7, (Jun. 1, 2009), pp. 713-719.

Conibeer, Gavin, et al., "Selective Energy Contacts for Potential Application to Hot Carrier PV Cells", *3rd World Conference on Photovoltaic Energy Conversion*, (May 11-18, 2003), pp. 2730-2733.

Conibeer, G. J., et al., "Slowing of carrier cooling in hot carrier solar cells", *Thin Solid Films*, (2008), pp. 1-6.

Conibeer, Gavin, "Third Generation Photovoltaics", *Proceedings of SPIE, Nanoscale Photonic and Cell Technologies for Photovoltaics II*, vol. 7411, (Aug. 20, 2009), pp. 74110D-1 to 74110D-9.

Ghosh, K., et al., "Material Selection for Three Level Transition Using Quantum Well Structure", *33rd IEEE Photovoltaics Conference*, (May 12-16, 2008).

Green, Martin A., "Third Generation Photovoltaics Advanced Solar Energy Conversion", Published by Springer, (2006), pp. 81-93.

Green, Martin A., "Third Generation Photovoltaics, Advanced Solar Energy Conversion", Published by Springer, (2003), pp. 35-43.

Hanna, Mark C., et al., "Hot Carrier Solar Cells", *Future Generation Photovoltaic Technologies: First NREL Conference*, (1997), pp. 309-316.

Honsberg, Christiana B., et al., "Nanostructured Solar Cells for High Efficiency Photovoltaics", *4th World Conference on Photovoltaic Energy Conversion*, (May 7-12, 2006), pp. 2565-2568.

Jani, Omkar, et al., "Characterization and Analysis of InGaN Photovoltaic Devices", *31st IEEE Photovoltaic Specialists Conference*, (Jan. 3-7, 2005).

Jani, Omkar, et al., "Design, Growth, Fabrication and Characterization of High-Band Gap InGaN/GaN Solar Cells", *4th World Conference on Photovoltaic Energy Conversion*, (May 7-12, 2006), pp. 20-26.

Kendig, Dustin, et al., "Characterization of Defects in Photovoltaics Using Thermoreflectance and Electroluminescence Imaging", *35th IEEE Photovoltaic Specialists Conference (PVSC)*, (Jun. 20, 2010), pp. 001733-001736.

Keogh, William M., et al., "Constant voltage I-V curve flash tester for solar cells", *Solar Energy Materials & Solar Cells*, vol. 81, (2004), pp. 183-196.

Kim, Sung J., et al., "Multiple exciton generation and electrical extraction from a PbSe quantum dot photoconductor", *Applied Physics Letters*, vol. 92, (2008), pp. 031107-1 to 031107-3.

Luque, A., et al., "Ultra-high efficiency solar cells: the path for mass penetration of solar electricity", *Electronics Letters*, vol. 44, No. 16, (Jul. 31, 2008).

Nelson, Jenny, "The Physics of Solar Cells", Published by Imperial College Press, (2003), pp. 188-191, 309-316.

Nozik, Arthur J., "Multiple exciton generation in semiconductor quantum dots", *Chemical Physics Letters*, vol. 457, No. 1-3, (May 20, 2008), pp. 3-11.

Shockley, William, et al., "Detailed Balance Limit of Efficiency of p-n Junction Solar Cells", *Journal of Applied Physics*, vol. 32, No. 3, (Mar. 1961), pp. 510-519.

Takeda, Yasuhiko, et al., "Hot carrier solar cells operating under practical conditions", *Journal of Applied Physics*, vol. 105, No. 7, (Apr. 8, 2009), pp. 74905-1 to 74905-10.

Wurfel, Peter, "Physics of Solar Cells, From Basic Principles to Advanced Concepts", Published by Wiley-VCH Verlag GmbH & Co., (2009), pp. 173-177.

Wurfel, Peter, "Solar energy conversion with hot electrons from impact ionisation", *Solar Energy Materials and Solar Cells*, 46, (1997), pp. 43-52.

"Office Action Dated Feb. 12, 2015; Chinese Patent Application No. 201180043460.7", (Feb. 12, 2015).

"Office Action Dated Mar. 17, 2015; Japanese Patent Application No. 2013-519701", (Mar. 17, 2015).

"Notice of Allowance Dated Jul. 14, 2015; Japanese Patent Application No. 2013-519701", (Jul. 14, 2015).

*Primary Examiner* — Eli Mekhlin

(74) *Attorney, Agent, or Firm* — Blakely Sokoloff Taylor & Zafman LLP

(57) ABSTRACT

Designs of extremely high efficiency solar cells are described. A novel alternating bias scheme enhances the photovoltaic power extraction capability above the cell band-gap by enabling the extraction of hot carriers. When applied in conventional solar cells, this alternating bias scheme has the potential of more than doubling their yielded net efficiency. When applied in conjunction with solar cells incorporating quantum wells (QWs) or quantum dots (QDs) based solar cells, the described alternating bias scheme has the potential of extending such solar cell power extraction coverage, possibly across the entire solar spectrum, thus enabling unprecedented solar power extraction efficiency. Within such cells, a novel alternating bias scheme extends the cell energy conversion capability above the cell material band-gap while the quantum confinement structures are used to extend the cell energy conversion capability below the cell band-gap. Light confinement cavities are incorporated into the cell structure in order to allow the absorption of the cell internal photo emission, thus further enhancing the cell efficiency.

24 Claims, 13 Drawing Sheets

700A

700B

700C

700D

ALTERNATING BIAS HOT CARRIER SOLAR CELLS

CROSS-REFERENCE TO RELATED APPLICATIONS

This application is a continuation of U.S. patent application Ser. No. 13/245,527 filed Sep. 26, 2011, now U.S. Pat. No. 8,536,444, which is a divisional of U.S. patent application Ser. No. 13/165,590 filed Jun. 21, 2011, now U.S. Pat. No. 8,217,258, which is a continuation-in-part of U.S. patent application Ser. No. 12/833,661 filed Jul. 9, 2010, now abandoned.

BACKGROUND OF THE INVENTION

1. Field of the Invention

The present invention relates to the field of solar cells, solar power systems and methods.

2. Prior Art

Solar Cell Efficiency Loss Mechanisms

Today's solar cells operate substantially below the theoretical efficiency level established by Sockley-Queisser Model (SQ-Model [W. Shockley and H. J. Queisser, "Detailed Balance Limit of Efficiency of p-n Junction Solar Cell", J. App. Phys., Vol. 32, pp. 510-519, March 1961]). The solar cell designs described herein can exceed the limit established by the SQ-Model. In order to improve the solar cell efficiency toward exceeding the SQ-Model, it is important to understand the mechanisms that cause the degradation in solar cell efficiency. FIG. 1 (adapted from "Third Generation Photovoltaics: Advanced Solar Energy Conversion", M. A. Green, Springer, New York, 2003, pp. 35-43) illustrates these efficiency degradation mechanisms in the single junction solar cell. Referring to FIG. 1, the efficiency loss mechanisms in a solar cell include the effects listed below.

❶ Represents incoming photons with energies ($E_p$) below the band-gap (labeled $E_g$) of the device that are not absorbed, thus their energy is not converted into current by the solar cell.

❷ Represents incoming photons with energies above the band-gap which are absorbed but lose their excess energy as heat due to the relaxation of the photo-excited electrons and holes (carriers) to the conduction band minimum (CBM) and the valence band maximum (VBM); respectively, by producing phonons (represented in FIG. 1 by the dashed lines). In this loss mechanism, first the photo-excited carriers having energies above the solar cell material band-gap will equilibrate with other carriers to form a carrier population that can be described by a Boltzman distribution, as shown in FIG. 2, wherein:

$\hat{1}$ Thermal equilibrium before polychromatic light pulse.
$\hat{2}$ Photo excited carrier immediately after polychromatic pulse.
$\hat{3}$ Carrier scattering.
$\hat{4}$ Thermalization of "hot carriers" (carrier/carrier equilibration).
$\hat{5}$ Hot carrier cooling (carrier/lattice equilibration).
$\hat{6}$ Lattice thermalized carriers.
$\hat{7}$ Recombination of carriers.
$\hat{8}$ Return to thermal equilibrium.
$\mu$ Electrochemical potential
$E_g$ Solar cell material band-gap
QFL Quasi-Fermi Levels caused by the distribution of photo-excited carriers At this point the temperature defining the carrier distribution would be above the material lattice temperature and hence the carriers are referred to as "hot carriers". Typically the additional energy associated with the elevated temperature is contained mainly by the electron due to its lower effective mass. In a typical solar cell, the hot electrons will equilibrate with the cell material lattice by giving off their excess energies to the cell material lattice by producing phonons during their cooling time $\tau_c$ period (see FIG. 2). These phonons then interact with other phonons and the absorbed photon energies $E_p$ in excess of the cell material band-gap $E_g$ are lost to heat and hence are not converted into voltage by the solar cell. Depending on the carrier mobility and crystal lattice characteristics of the cell material, the carrier cooling time $\tau_c$ occurs in a timescale of a few picoseconds to a few nanoseconds (see FIG. 2). As illustrated in FIG. 2, by the end of the carrier cooling time $\tau_c$ the photo-excited carrier distribution will coalesce to a narrow energy distribution of electrons and holes near the edges of the conduction and valence bands of the cell material; CBM and VBM, respectively. This final stage of the photo-excited carrier lifetime would typically last for a few microseconds (carrier recombination time $\tau_r$) as the photo-excited carriers systematically recombine giving their residual gained energy to photons. In order for a conventional solar cell to be able to convert the energy of the photo-excited carriers to electric energy, the photo-excited carriers must be separated and transported toward the cell contacts before they recombine, meaning before the elapse of the carrier recombination time $\tau_r$. The design parameters of conventional solar cells are typically selected to achieve the carrier transport characteristics needed to transport the photo-excited carriers to the cell contacts before they recombine; i.e., before the elapse of the carrier recombination time $\tau_r$. From the above discussion, the solar photon energy given to the photo-excited carriers would be dissipated in two main stages; namely carrier cooling and carrier recombination. During the former of these two main stages; namely the cooling stage, the photo-excited carriers give their energy in excess of the material band-gap energy separation to phonons while during the latter stage; namely the recombination stage, the photo-excited carriers give their residual energy, which is typically equal to the material band-gap energy separation, to photons through radiative recombination.

❸ Represents photo-excited carriers (electrons and holes) which recombine radiatively before being extracted and produce either a photon with energy equal to the band-gap or possible multiple photons with energies less than the band-gap. This radiated energy is not necessarily lost as these photons can be reabsorbed. However, these radiated photons, unless confined, will be re-emitted from the cell back toward the incoming sunlight and lost forever—an effect that ultimately restricts the maximum efficiency that can be achieved by the solar cell. In most bulk semiconductor materials, the timescale of carrier recombination is typically less than a few microseconds (see FIG. 2). For the solar cell to be efficient, most photo-excited carriers must be transported to the cell contacts and extracted before the carriers recombine, although at that point the energy separation of the electrons and holes to be extracted from the cell would only be comparable to the cell material band-gap energy.

❹ Represents photo-excited carriers (electrons and holes) which recombine non-radiatively with the help of electronic states within the band-gap. These states are typically caused by defects in the solar cell material lattice structure or by impurity atoms, and the resultant non-radiative carrier recombination would produce phonons, thus the energy of the absorbed solar photons that caused the excitation of these carriers is transferred to heat rather than being converted into current by the solar cell. This loss mechanism is one of the main efficiency loss mechanisms in monolithic multi-junction stack solar cells where the lattice mismatch between successive layers can create lattice misfit dislocations which can severely diminish the solar cell performance by creating additional regions at the stacked cells boundaries where carriers can non-radiatively recombine.

❺ Represents photo-excited carriers (electrons and holes) which are not effectively extracted by the solar cell contacts. This loss mechanism is typically caused by high resistance at the cell contacts that tends to cause inefficiency in extracting the carriers out of the cell, thus ultimately limiting the maximum efficiency that can be achieved by the solar cell. This mechanism is also an important efficiency loss mechanism in monolithic multi-junction stack solar cells as there are only two contacts to extract the current from the multi-junction stack, making the lowest individual current producing cell structure within the stack limit the total current of the entire multi-junction stack. Also this loss mechanism is the main culprit behind the difficulty in extracting hot carriers from solar cells as these carriers tend to rapidly cool down at the contact, an effect that causes the hot carriers to congregate near the cell junction, making it difficult to extract these carriers before they cool down.

In addition to the above efficiency loss mechanisms, the theoretical model typically used to predict solar cell efficiency, namely the SQ-Model, includes certain assumptions that limit the perceived efficiency that can be achieved by solar cells—thus somewhat preventing solar cell designers from pushing their designs to their true limits. The most relevant of these assumptions are listed below.

1. The input is the un-concentrated solar spectrum;
2. Each incident solar photon will produce only one electron-hole pair;
3. The cell can achieve only one Quasi-Fermi Level (QFL) separation;
4. The cell is operating at thermal equilibrium with the cell and carrier temperatures being equal; and
5. The cell is operating in steady state current flow condition.

The solar cell efficiency limit based on the SQ-Model is calculated by examining the amount of electrical energy that can be extracted per incident solar photon. Since the incident solar photon excites an electron from the solar cell material valence band to its conduction band, only photons with more energy than the cell material band-gap will produce power. That means that the theoretical conversion efficiency of a silicon (Si) solar cell with band-gap at 1.1 eV would be less than 50% since almost half of the photons within the solar spectrum have energy below 1.1 eV. Considering the difference in the energy between the solar photon being absorbed from the sunlight at 6000° K and the cell operating at 300° K, the SQ-Model equilibrium assumption would imply that any solar photon energy above and beyond the cell material band-gap energy would be lost. Since blue photons have roughly half of the solar energy above 1.1 eV, the combination of these two assumptions would result in a theoretical efficiency peak performance of approximately 30% for a single junction Si solar cell.

In addition to the efficiency limitations implied by the SQ-Model assumptions, there are several other considerations that are implied by the material system used in the solar cell, such as the carrier production rate and mobility characteristics of the material system. These types of considerations do not affect the efficiency of the cell under normal conditions, but introduce further limits under certain conditions (for example, an increase in the number of incident solar photons due to concentration). The first of these two effects, namely, the carrier production rate, sets a saturation (or a maximum) level on the rate in which carriers are produced within the cell material as a result of photo-excitation, and hence limits the amount of energy that can be extracted from the cell. Intuitively, as the number of solar photons incident on the cell surface increases, the amount of energy that can be produced by the cell should increase. However, such is not the case in some material systems (such as Si, for example) in which, due to low electron mobility, the number of holes increases with the increase of photo-excitation at a rate that is much faster than electrons. This hole and electron density imbalance will cause photo-excited electrons to recombine with the abundantly available holes before they can be extracted, thus placing a limit on the number of electron/holes that can be extracted from the cell. In Si cells, this limiting rate (equilibrium) is reached at less than 2-sun of incident light. As a result, when twice as much sunlight is incident on the surface of a Si solar cell, the carrier production rate would only be slightly higher than with 1-sun, making the ratio of the input energy to output energy lower, which represents a much lower efficiency. For that reason Si solar cells are not effective with solar concentrators.

The electron mobility in other material systems, such as gallium arsenide (GaAs) or gallium nitride (GaN), is much higher than that in silicon, enabling photo-excited electrons to reach the cell junction more quickly, thus alleviating the occurrence of holes/electron density imbalance and reducing the chances that electrons and holes will recombine before they can be extracted, which in turn would allow an increase in the number of incident solar photons to continue to result in an increase in the number of photo-excited carriers before equilibrium is reached. This increase in electron mobility, therefore, would allow solar cells made from such material systems to have an increased efficiency under concentrated sunlight.

The discussion in the following sections of this disclosure is intended to highlight several novel design approaches that would circumvent many of the efficiency loss mechanisms explained above and therefore allow the alternating bias solar cell designs described in the following sections to offer extremely high solar power conversion efficiency. Subsequent sections of the disclosure will discuss the cost/efficiency performance of multiple embodiments of the alternating bias solar cells and compare it with the performance achieved by current conventional solar cells. The objective of the discussion below is therefore to show that the cost/efficiency performance predicted to be achieved by the alternating bias solar cell of this invention could offer a solar energy cost per kWh that reaches the $3^{rd}$ Generation (3G) target of the photovoltaic solar cell industry.

Harnessing Hot Carriers

As explained earlier, one of the primary loss mechanisms in solar cells is the loss of incident solar photons with energy above the cell material band-gap due to hot carrier relaxation, loss mechanism ❷ in FIG. 1. Although it is theoretically possible for hot electrons to be separated and collected at contacts before cooling occurs, this is not observed in conventional solar cells due to the fast thermalization of hot carriers (short cooling time, $\tau_c$). Currently there are two concepts being envisioned by researchers in the field for increasing solar cell efficiency utilizing hot carriers, namely, direct extraction using selective energy contact (SEC) and multiple exciton generation (MEG). Both concepts rely on first slowing down the carrier cooling, but the hot carrier energy is harnessed in different ways.

Theoretical treatments of direct hot carrier extraction using SEC, which is illustrated in FIG. 3A ("Solar Energy Material and Solar Cells", P. Würfel, 46 (1997), pp. 43-52), is widely published and have shown that substantial solar cell efficiency increase near the thermodynamic limit of 68% from a single junction cell ("The Physics of Solar Cells" J. Nelson, Imperial College Press, 2003, pp. 309-316) would be possible if hot carriers could be effectively extracted. However, it is not easy to separate hot (high energy) electrons and holes (carriers) to the cell contacts because these hot carriers tend to lose their high energy through the interaction with phonons that cause the high energy of hot carriers to be rapidly lost as heat. The entire concept behind maintaining the photo-excited hot carrier population within the cell in both SEC and MEG approaches is to minimize the electron-phonon interactions. However, in the vicinity of metal contacts, it is very easy for the hot carriers to cool down through the large number of available electronic states in the contacts. Therefore, hot carriers would typically tend to congregate near the cell junction, making it even more difficult to transport and extract these carriers before they cool down. In typical solar cell materials, the distance the hot carriers can travel through the cell material before cooling tends to be very short (less than a micron), making it more difficult to transport the hot carrier to the cell contacts before they cool down.

It should be noted that the principle of the SEC approach is to use a contact material having a narrow density of states with large band-gap between the next available states ("Solar Energy Material and Solar Cells", P. Würfel, 46 (1997), pp. 43-52). However, a narrow density of states would also yield extremely low electron mobility and therefore there must be some level of compromise between the narrowness of the density of states and maintaining high enough conductivity through the contact. An additional issue that will need to be addressed before SEC becomes feasible is the geometry of the cell and its associated contacts. Given that the distance the hot carriers can travel before cooling is typically very short, it would be necessary to design the cell structure such that carriers are generated very close to the SEC contact to ensure the carriers do not cool before being collected at the contact. Therefore, very short absorber regions and/or convoluted surfaces may be required to minimize the distance the hot carriers will have to travel ("Third Generation Photovoltaics: Advanced Solar Energy Conversion", M. A. Green, Springer, New York, 2003, pp. 35-43).

The other possibility for increasing the efficiency of solar cells utilizing hot carriers is through MEG ("Third Generation Photovoltaics Advanced Solar Energy Conversion", M. A. Martin, Springer 2006, pp 81-88). In this case, the excess energy of the hot electrons is used to create additional excitons, i.e., bound electron-hole pairs. The hot electron must have the energy of at least two times the band-gap $E_g$ to create one additional electron-hole pair. This process is not limited to electrons with energy of twice the band-gap, but it can also be extended to electrons with higher energies. Under 1-sun AM1.5 spectrum, the predicted theoretical efficiency of MEG-enhanced cells is over 44%, while under maximum sunlight concentration, the efficiency can approach that of SEC cells. Although MEG can occur in bulk semiconductors, its probability of occurrence is so low that it does not contribute much to the efficiency of the cell ("Third Generation Photovoltaics", Gregory F. Brown and Junqiao Wu, Laser & Photon Rev., 1-12 (2009), published online: 2 Feb. 2009).

As stated earlier, slowing the cooling of hot carriers is prerequisite for both the SEC and MEG approaches and the most widely pursued way for achieving this by ongoing research in the field is through the use of quantum confinement structures. There are cases wherein hot carriers' cooling time exceed the typical cooling time in bulk semiconductors. This phenomenon is expected to occur in many material systems incorporating quantum confinement structures. First, multiple quantum wells (MQWs) and quantum dots (QDs) were studied and found to have hot carrier cooling times much larger than that of bulk semiconductors ("Third Generation Photovoltaics", Gregory F. Brown and Junqiao Wu, Laser & Photon Rev., 1-12 (2009), published online: 2 Feb. 2009). Hot carrier cooling times approaching a few tens of nanoseconds have been observed in these types of structures. This increase has been attributed to the phenomenon known as the phonon bottleneck effect in quantum structures. Typically hot electrons cool through interactions with optical phonons and due to the presence of quantum confinement, a non-equilibrium level of optical phonons can be created. Due to the phonon bottleneck effect caused by the quantum confinement aspects of MQWs or QDs, these optical phonons cannot equilibrate with the lattice fast enough, thereby slowing the further cooling of hot electrons—extending their cooling time $\tau_c$ (see FIG. 2). Within the two dimensional quantum confinement of MQWs, the phonon bottleneck effect occurs at high carrier photo-excitation densities that require relatively high illumination levels, such as those typically occurring under sunlight concentration. However, due to the three dimensional quantum confinement aspects of QDs, the phonon bottleneck effect is expected to occur under all illumination levels. As a result of the slowed down cooling of hot carriers in MQWs and QDs, these types of device structures are expected to play an important role in hot carrier extraction.

In principle, in the SEC hot carrier cell illustrated in FIG. 3A, with the hot carrier cooling being slowed down by the quantum confinement structures incorporated with the cell material, there would be sufficient time to transport the carriers to the contacts while they are still hot where they can be collected at their high energy level by the narrow density of states of the contacts. This would theoretically allow an increase in the photovoltage yielded by the cell. However, the increased photovoltage at the cell contacts would tend to counteract the built-in potential $V_{bi}$ responsible for transporting the carriers to the cell contacts. As a result, the time it would take to transport the carriers to the contacts (carrier extraction time) would be substantially increased to the point that could reach the carrier recombination time $\tau_r$.; meaning the carriers would recombine before reaching the contacts due to the weakening of the cell carrier built-in transport mechanism, which in turn would result in a substantial reduction in the photocurrent yielded by the cell with net energy extraction that is not substantially greater than that of a conventional cell. So although SEC hot carrier cells can in theory generate higher photovoltage, the realized increase would most likely be more than offset by the reduction in photocurrent that is a direct consequence of the prolonged carrier extraction time.

Given the increased attention to renewable energy, in particular photovoltaic (PV) solar cells, there is an increasing demand to increase the efficiency of PV cells without substantially increasing their cost. Hot carrier PV solar cells have been theoretically predicted to be able to offer a substantial increase in the PV cell efficiency, but to date none of these predictions have been realized. The two hot carrier solar cell approaches discussed earlier require means for increasing the carrier cooling time, which require the inclusion of quantum confinement structure within the cell material, which in turn would very likely increase the cell cost. The benefits of MEG hot carrier cells can only be realized under very high solar concentration that renders that approach impractical. In addition to requiring special types of contacts that often require the use of a multi layer superlattice, the SEC hot carrier solar cell approach appears to suffer from a built-in deficiency that counteracts its ability to reach a higher energy efficiency than what a conventional PV cell can offer. Given the high demand for more efficient and less costly PV solar cells and the weaknesses of the approaches currently being pursued to attain this objective, a PV solar cell approach that can effectively realize higher efficiency without significant increase in the solar cell will most likely have a substantial market value.

DETAILED DESCRIPTION OF THE PREFERRED EMBODIMENTS

References in the following detailed description of the present invention to "one embodiment" or "an embodiment" mean that a particular feature, structure, or characteristics described in connection with the embodiment is included in at least one embodiment of the invention. The appearance of the phrase "in one embodiment" in various places in this detailed description is not necessarily all referring to the same embodiment.

Rather than relying on slowing down the hot carrier cooling as in the described prior art, the approach for harvesting hot carriers to be described herein relies instead on accelerating the hot carrier extraction. The approach for hot carrier extraction described herein stems from the observation that if the carrier extraction is fast enough, it may be possible to extract the carriers before their high energy is lost to heat. This could be accomplished if the intensity of the electric field responsible for transporting the carriers to the contacts can be instantaneously increased within the duration of the hot carrier cooling time $\tau_c$, meaning before the carriers cool down. The effect of such an increase in the intensity of electric field would be to increase the transport velocity of the hot carriers to the extent that the carrier extraction time would become shorter than the carrier cooling time $\tau_c$, thus enabling the extraction of carriers while they are still "hot"; meaning while the carriers still have an energy level above the edge of the cell band-gap If this can be accomplished, it would most certainly be much easier to implement at the device level than the currently predominant approach being pursued of using complex superlattice contacts in the vicinity of where the hot carriers are concentrated, which has proven to be geometrically fairly difficult to achieve. The hot carrier extraction capabilities of such an approach would not be restricted by any of the selective energy aspects of a complex superlattice contact explained earlier, and would not impose any geometric constraints that would complicate the solar cell device structure. Rather, it would be applied in conjunction with conventional bulk material as well as quantum confinement based solar cells with additions only at the circuit level rather than at the device material level. The following discussion provides further details on the application of this approach in bulk material cells, for the remainder of this section, and in cells incorporating quantum confinement structures, for which the carrier acceleration approach described herein is equally applicable, in the subsequent sections.

Figure 3A:
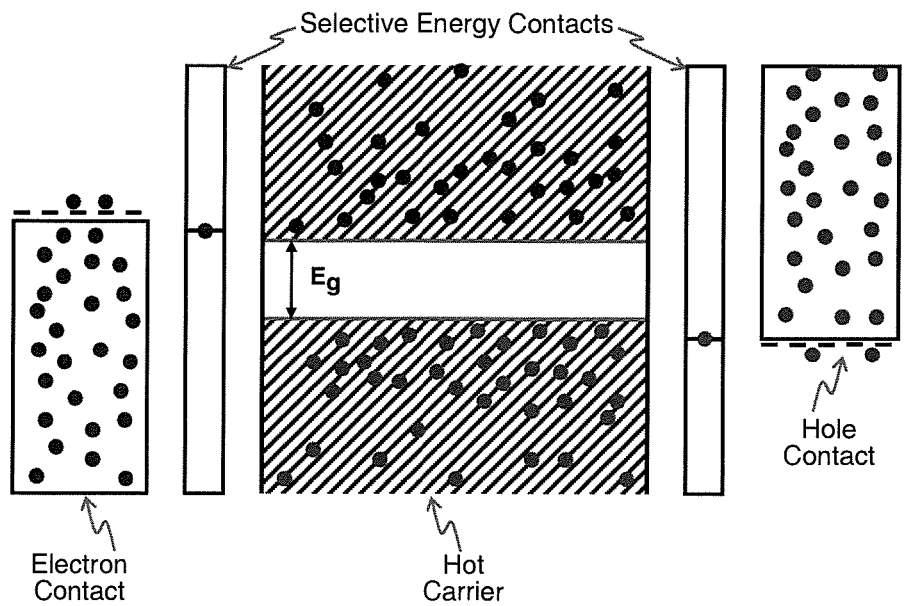
FIG. 3A illustrates the energy band structure of prior art photovoltaic solar cells that use selective energy contacts.
Figure 3B:
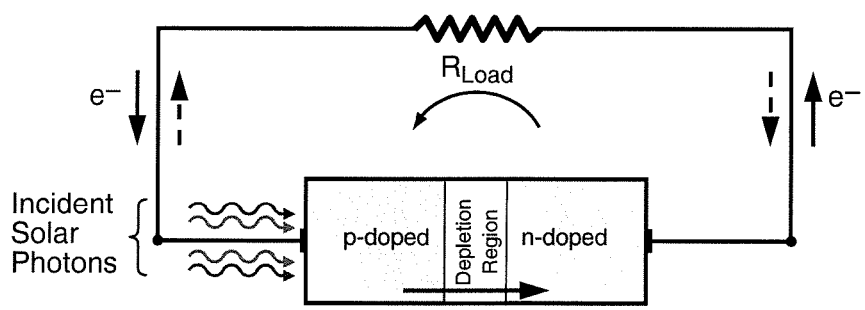
FIG. 3B illustrates the electron flow in conventional fixed bias regime solar cells.

Without illumination, bringing the n-doped and the p-doped sides of a solar cell into contact causes a temporary current flow of electrons from the n-doped side to the p-doped side of the cell to offset the contact potential caused by the difference in the Fermi levels of the two sides of the cell junction; conventionally known as the built-in potential $V_{bi}$ of the junction. This temporary current flow stops once the electric field formed by the diffused charges at the cell junction offsets the contact diffusion force acting on the electrons and holes. Under illumination, the photo-excitation caused by the incident solar photons causes an increase in the carrier population density within the cell as photo-excited electrons from the valence band of the p-doped side of the cell are promoted to the conduction band. With this increase in photo-excited carrier population within the cell, the built-in electric field $\epsilon_{bi}$ of the cell separates the photo-excited carriers and causes electrons and holes to move toward the cell n-contact and p contact, respectively. When a load is connected across the two sides of the cell, as illustrated in FIG. 3B, the photo-excited electrons flow within the cell from the direction of the p-doped side to the n-doped side of the cell where they are extracted at the n-doped side contact and flow into the connected load, lose their energy while moving into the load, and return back to the cell through the contact at the p-doped side of the cell where they recombine with the awaiting holes in the p-doped side of the cell. This forward bias flow of electrons within the solar cell and the connected load is illustrated in FIG. 3B.

Referring to FIG. 3B, depending on the value of the load resistance $R_{Load}$ across the cell contacts, the photovoltage built-up at the cell contacts will cause an electric field $\epsilon_{pv}$ across the cell junction that counteracts the cell internal electric field $\epsilon_{bi}$ responsible for the carrier transport effect. As the photovoltage across the cell contacts increases, the cell internal electric field $\epsilon_{bi}$ caused by the cell built-in potential $V_{bi}$ becomes weakened by the opposing electric field $\epsilon_{pv}$ causing photovoltage build-up at the cell contacts. As a consequence the photo-excited carrier transport towards the cell contacts is systematically weakened making a lesser number of photo-excited carriers able to reach the cell contacts before they recombine. This effect is detrimental to hot carrier solar cells since the cell transport mechanism is primarily the cell internal electric field $\epsilon_{bi}$ caused by the cell built-in potential $V_{bi}$ while the energy of the electrons to be extracted from the cell, and therefore the photovoltage across the cell contacts they are expected to generate, is now much higher than the photovoltage of a conventional solar cell. As explained earlier, the higher photovoltage sought after from hot carrier extraction weakens the built-in carrier transport mechanism of the cell leading to a reduced photocurrent, thus rendering the higher power extraction efficiency of hot carrier solar cells unattainable.

Figure 4:
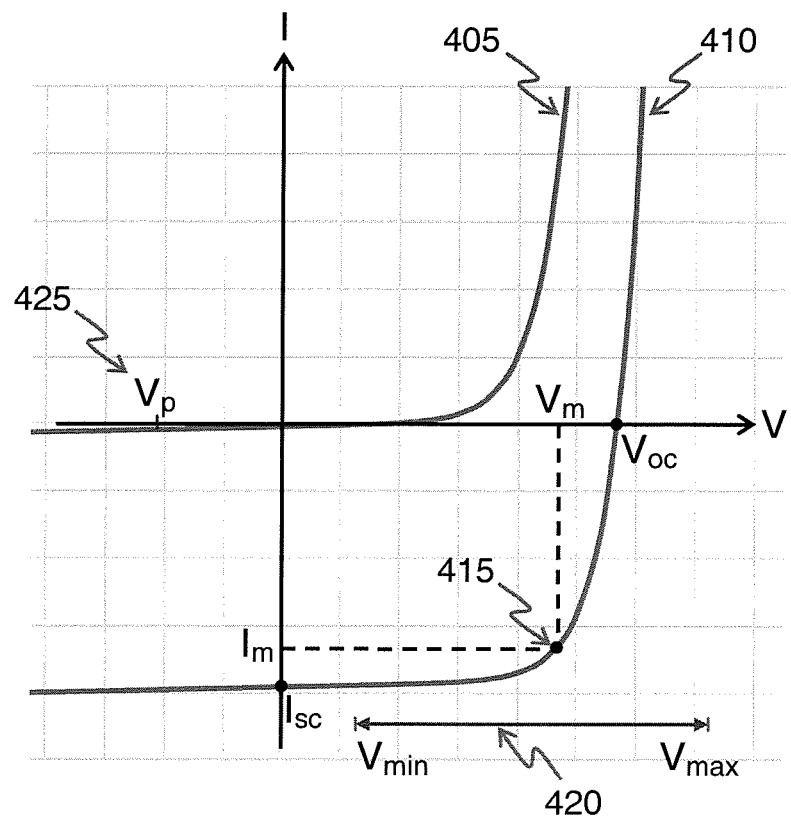
FIG. 4 illustrates the current-voltage (I,V) characteristics of a conventional p-n junction solar cell in the dark and under illumination.

FIG. 4 illustrates the current-voltage (I,V) characteristics of a conventional p-n junction solar cell in the dark (405) and under illumination (410). In order to maximize the yielded output power from today's conventional single junction solar cells, the value of the load resistance $R_{Load}$ is typically selected at a balance point between the counteracting electric fields $\epsilon_{bi}$ and $\epsilon_{pv}$, namely, the electric fields caused by the cell built-in potential $V_{bi}$ and the photovoltage built-up at the cell contacts, that will achieve the maximum yielded photovoltage ($V_m$) and photocurrent ($I_m$) from the cell. The maximum yielded photovoltage ($V_m$) and photocurrent ($I_m$) are typically achieved by the cell at a bias in the vicinity of knee point (415) of the (I,V) curve of FIG. 4. In order to achieve these maximum photovoltage $V_m$ and photocurrent $I_m$ values, the balance between the two counteracting electric fields $\epsilon_{bi}$ and $\epsilon_{pv}$ must leave a carrier transport force that is sufficient to transport the maximal number of photo-excited carriers to the contacts before the carriers recombine. With a typical value of cell built-in potential $V_{bi}$ of ~1 volt generating an internal electric field across the junction depletion region of a few microns, the carrier transport velocity (also conventionally known as the drift velocity) can reach saturation velocity typically in the range ~$10^7$ cm/s across the cell depletion region. When the photovoltage across the cell contacts is at a minimal value, this level of carrier transport velocity can readily transport the photo-excited carriers to the cell contacts well before the carriers recombine. This is clear in FIG. 4 which shows the photocurrent generated by the cell is at its maximum value when the cell photovoltage is below the knee point (415) of the (I,V) curve of FIG. 4. However, when the photovoltage across the cell contacts is at the highest possible value, which is typically in the range of the cell band-gap (typically 1.1 eV in silicon and 1.4 eV in gallium arsenide), the resultant electric field across the cell contacts $\epsilon_{pv}$ weakens the cell internal electric field $\epsilon_{bi}$ to the extent that the carriers transport to the cell contacts all but stops and the cell photocurrent diminishes to a minimal value as the carriers recombine before reaching the cell contacts and getting extracted from the cell. This is clear in FIG. 4 which shows the photocurrent generated by the cell quickly diminishes to a minimal value when the cell photovoltage is above the knee point (415) of the (I,V) curve of FIG. 4. This condition is severely exacerbated in hot carrier solar cells since the main objective behind such cells is to extract hot electrons with energy substantially higher than the cell material band-gap energy because when the cell photovoltage reach values substantially higher than the cell material band-gap energy, the cell internal field $\epsilon_{bi}$ responsible for carrier transport would have been sufficiently weakened to the point that no photo-excited carrier at any energy level can reach the cell contacts.

Figure 5A:
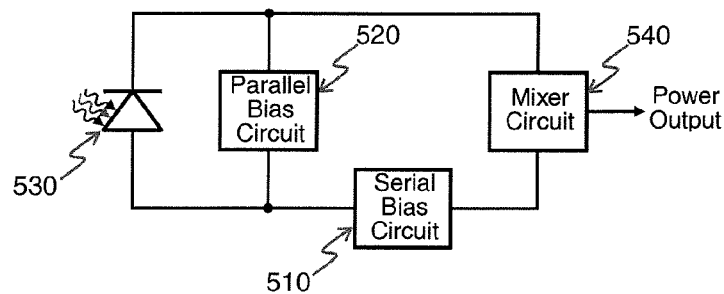
FIG. 5A presents a high level block diagram of the preferred embodiment of the variable bias hot carrier solar cell of this invention.

A high level block diagram of the preferred embodiment of the hot carrier solar cell design of this invention is illustrated in FIG. 5A. This preferred embodiment of the hot carrier solar cell of this invention overcomes the drawback encountered in prior art hot carrier cell designs described earlier by allowing the photovoltage generated by the cell to vary intermittently between a minimum ($V_{min}$) and a maximum value ($V_{max}$) such that the average transport velocity of photo-excited carriers across the cell is maintained at a value that would result in the transport of the photo-excited carriers to the cell contacts before the carriers cool down, meaning within a time duration that is shorter than the carrier cooling time $\tau_c$. The minimum $V_{min}$ value of the alternating photovoltage of the hot carrier solar cell 500 design of this invention would be selected at a point the cell internal built-in electric field $\epsilon_{bi}$ is still at its highest value, meaning the point at which the photo-excited carrier transport velocity can reach its maximum value. The maximum value $V_{max}$ of the alternating photovoltage of the hot carrier solar cell 500 of this invention would be selected at a value that is substantially commensurate to the maximum value of the electrochemical potential of the photo-excited carriers within the solar cell 500. (The electrochemical potential is the energy separation between the Quasi Fermi levels of the semiconductor material caused by the photo-excitation by solar photons.) Such maximum value $V_{max}$ of the alternating photovoltage of the hot carrier solar cell 500 of this invention would be selected at the highest photovoltage that can be achieved by the cell without regard to the counteracting effect such a high photovoltage value would have on diminishing the value of the cell internal built-in electric field $\epsilon_{bi}$. The possible range of the values of $V_{min}$ and $V_{max}$ relative to the (I,V) characteristics of a conventional solar cell is illustrated in FIG. 4 with reference number 420. The alternation of the photovoltage of the hot carrier solar cell 500 of this invention between the minimum $V_{min}$ and maximum $V_{max}$ values selected based on the above criteria would result in alternating time periods during which the photo-excited carrier transport velocity across the cell reaches maximum and minimum values, respectively. Depending on the duty cycle of the alternation between the minimum and maximum values of the photovoltages of the hot carrier cell of this invention, the resultant average transport velocity of the photo-excited carriers can be sustained at a value that would provide a continuous transport of carriers toward the cell contacts, and hence photocurrent, even when the cell photovoltage is at the maximum value of its alternation cycle.

Figure 5B:
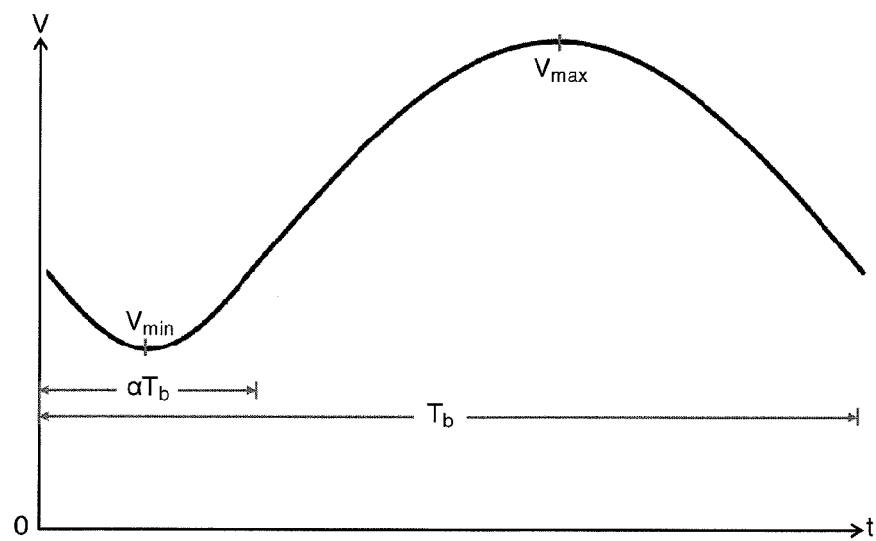
FIG. 5B illustrates the waveform of the photovoltage of the variable bias hot carrier solar cell of this invention.

FIG. 5B illustrates the waveform representing the alternation of the photovoltage of the hot carrier cell 500 of this invention. As illustrated in FIG. 5B, the alternation of the photovoltage of the hot carrier solar cell 500 of this invention between its minimum $V_{min}$ and maximum $V_{max}$ values would have a time duration $T_b$. The first key parameter of the waveform illustrated in FIG. 5B that represents the alternation of the photovoltage of the hot carrier cell 500 of this invention is the percent of the cycle $T_b$ during which the photovoltage is allowed to reach its minimum $V_{min}$ value, which is represented in FIG. 5B as $(\alpha T_b)$ would have to be maintained long enough to sustain the needed average transport velocity for the photo-excited carriers yet short enough to keep the average photovoltage achieved by the hot carrier cell 500 at the highest possible value. The dominant portion of the photo-excited carrier transport to the contacts of the hot carrier solar cell 500 of this invention will take place during the time period $(\alpha T_b)$ of the photovoltage alternation cycle $T_b$ when the internal built-in field $\epsilon_{bi}$ of the cell is allowed to increase to its maximum value during the alternation cycle $T_b$. Since as stated earlier, when the cell photovoltage is at its minimum value $V_{min}$, the photo-excited carriers transport velocity can reach ~$10^7$ cm/s during the time period $(\alpha T_b)$, which is sufficient to transport photo-excited carriers close to 100 µm in 1 ns. In taking into account the transient effect of the carrier transport velocity build up and decay during the time period $(\alpha T_b)$, it is reasonable to assume that the average transport velocity of the photo-excited carriers during the time period could only reach ~$0.1 \times 10^7$ cm/s, which is still sufficient to transport photo-excited carriers close to 10 µm in 1 ns. Which means that if the sub-interval of the photovoltage alternation period during which the cell photovoltage reaches its minimum value $V_{min}$ $(\alpha T_b)$=1 ns, the cell internal field $\epsilon_{bi}$ will be able to transport the photo-excited carriers within that time interval close to 10 µm. This implies that the time period $(\alpha T_b)$ can be selected depending on the average distance the photo-excited carriers have to be transported to the cell contacts. For example, in gallium arsenide (GaAs) single junction solar cells, the typical thickness between the cell emitter and base layers can be less than 5 µm, which implies that the photo-excited carriers in a GaAs solar cell will have to travel an average distance of 2.5 µm to be extracted at the cell contacts. This means that for a GaAs solar cell, $(\alpha T_b)$=0.25 ns will be sufficient to allow enough time to transport most all of the photo-excited carriers within the cell 500 to the contacts within the hot carrier cooling time $\tau_c$. Comparable values $(\alpha T_b)$ would apply for thin-film type solar cells such as cadmium telluride (CdTe), copper indium diselenide (CIS) and copper indium gallium diselenide (CIGS), since the typical thickness between the cell emitter and base layers of these types of solar cells can also be less than 5 µm. For indirect band-gap solar cells, such as silicon (Si) and germanium (Ge) solar cells, due to the larger light absorption length of these cells, the typical thickness of the cell emitter and base layers can be much larger than GaAs, CdTe and CIGS solar cells. However, the indirect band-gap, carrier mobility and crystal lattice characteristics of these cells can make the hot carrier cooling time $\tau_c$ in these cells be at least one order of magnitude longer than that of GaAs, CdTe and CIGS solar cells. In Si single junction solar cells, the typical thickness of the cell emitter and base layers can be 300 µm, which implies that the photo-excited carrier in a Si solar cell will have to travel an average distance of 150 µm to be extracted at the cell contacts. This means that for a Si solar cell, $(\alpha T_b)$=15 ns will be sufficient to allow enough time to transport most all of the photo-excited carriers within the cell 500 to the contacts within the hot carrier cooling time $\tau_c$.

It should be noted that although the value of carrier transport time is higher for Si solar cells, it is expected the hot carrier cooling time $\tau_c$ in Si will also be longer as well. Nonetheless, the subsequent discussion in this disclosure will show that the carrier transport time can be made substantially shorter when light confinement means are incorporated within the Si solar cell structure which would allow the contact-to-contact thickness in the Si cell to be substantially reduced. For such thin-Si solar cells that incorporate light confinement means, a 20 µm thick silicon film would have much higher absorptance than a 400 µm thick Si cell without light confinement means ("Physics of Solar Cells", Würfel, pp. 173-177). Furthermore, in thin-Si solar cells that incorporate light confinement means which also incorporate buried contacts, to be described in subsequent discussion, the distance between the cell contacts can be made to be on the order of 5 µm, which would in turn make the carrier transport time for this type of cell comparable to that of GaAs, CdTe and CIGS solar cells. This means that for a Si solar cell incorporating light confinement means $(\alpha T_b)$=0.25 ns can also be made possible.

The second key parameter of the waveform illustrated in FIG. 5B that represents the alternation of the photovoltage of the hot carrier cell 500 of this invention is the cycle $T_b$ during which the photovoltage goes through a full cycle from its minimum $V_{min}$ to maximum $V_{max}$ values. With the ability to transport the photo-excited carriers within the cell during the minimum photovoltage period $(\alpha T_b)$, what remains is to select the cycle $T_b$ to be substantially equal to or shorter than the carrier cooling time $\tau_c$. Since as explained earlier the hot carriers cooling happens, depending on the cell material crystal lattice characteristics, in a timescale of a few nanoseconds, the alternation of the photovoltage of the hot carrier cell of this invention, namely, the cycle $T_b$, can also be selected to be on the order of a few nanoseconds as well. By selecting the period $(\alpha T_b)$=0.25 ns for GaAs, CdTe, CIGS and thin-film Si types of solar cells, a value of the parameter $\alpha$=0.1, will result in a value for $T_b$=2.5 ns, which is short enough to ensure that the hot carrier generated by the cell within the cycle time $T_b$ would not have the chance to cool down before the occurrence of the sub-cycle $(\alpha T_b)$ during which substantially all of the hot carriers will be transported to the contacts of cell 500.

It should be noted that photo-excited carriers transport will continue to occur at varying transport velocities throughout the entire cycle $T_b$ with carriers that reach the cell 500 contacts at different instants within the cycle $T_b$ getting extracted at an energy level proportional to their energy level since the photovoltage across the cell 500 contacts is made to change during the cycle $T_b$ over a range of values that extend from below the band-gap energy of the cell to the desired maximum value corresponding to the energy of the hot carriers to be extracted from the cell 500. For conventional Si solar cells (meaning those not incorporating light confinement means or buried contacts), a larger value of the parameter $\alpha$ can be selected, for example $\alpha$=0.5, that would result in a value for $T_b$=30 ns, which could be sufficient to ensure that a substantial number of the photo generated hot carriers can be extracted from the cell before cooling since, as explained earlier, the hot carrier cooling time $\tau_c$ in Si based cells is expected to be substantially longer (close to one order of magnitude) than that in GaAs, CdTe, and CIGS based solar cells.

The variability of the photovoltage of the hot carrier cell 500 of this invention during the cycle $T_b$ from its minimum $V_{min}$ to maximum $V_{max}$ values allows the extraction of photo-excited carriers across an extraction energy range that can be made to substantially match the energy profile of the photo-excited carriers generated within the cell that spans from the band-gap energy of the cell up to the maximum energy level as defined by the selected maximum value the photovoltage of the cell 500 is allowed to reach during the cycle $T_b$. This is a distinctive feature that is unique to the hot carrier cell 500 of this invention, since all current conventional single junction photovoltaic solar cells can extract photo-excited carriers from the cell only at a single energy level. Only multi-junction solar cells can extract photo-excited carriers over a wide range of energy levels using costly stacks of p-n junctions, and even then at a single energy level per junction layer. In contrast, the hot carrier cell 500 of this invention can extract photo-excited carriers across a wide range of energy levels and using only a single junction. Due to the alternation of its photovoltage, the hot carrier solar cell 500 of this invention can be thought of as a solar cell that temporally sweeps through a wide range of extraction energies at a rate that is comparable to or faster than the carrier cooling rate $\tau_c$, thus allowing carriers to be extracted from the cell not only before cooling but also at an energy level that is commensurate with their energy level. It is also worth mentioning that since, as explained earlier, the carrier extraction energy in the hot carrier cell 500 of this invention cycles through a wide range of energy levels within the hot carrier cooling time $\tau_c$, the hot electron/hole pair (carrier pair) that reaches the cell contacts at a given value of electrochemical potential (energy separation) can also be transferred to the cell 500 load before they cool down at the contact since the instantaneous extraction energy difference between the cell 500 contacts will match the hot electron/hole pair energy level separation within the carrier pair cooling time interval $\tau_c$. This means that at any given instant of the cycle $T_b$, the instantaneous photovoltage of the cell 500, and hence potential separation between its contacts, would match the energy level separation of some of the hot electron/hole pairs photo-excited within the interval time interval $T_b \leq \tau_c$, thus allowing such carrier pairs to be transferred from the cell to the load through a contact having a matched energy separation before the decay of their energy level separation. This feature makes the hot carrier cell 500 of this invention to not require complex selective energy contacts to extract the hot carriers out of the cell. This is made possible because the alternating photovoltage of the hot carrier cell 500 of this invention makes available at any discrete instant of time within the alternation cycle $T_b$ of the cell photovoltage (which is comparable in duration to or shorter than the hot carrier cooling time interval $\tau_c$) an instantaneous and temporally discrete narrow extraction energy band at the cell contacts that lasts for a time interval that is substantially shorter than the hot carrier cooling time interval $\tau_c$ which is also made available cyclically at a rate $T_b$ that is equal to or shorter than the carrier's cooling time $\tau_c$. In other words the extraction energy levels at the contacts of the hot carrier cell 500 of this invention are made to be temporally energy selective as the photovoltage of the cell is alternated at a rate that is faster than the hot carrier cooling rate. In addition, beyond being temporally energy selective, the extraction energy level separation between the contacts of the hot carrier cell 500 is also made to temporally vary to cover a wide energy band that would span the extent from the cell band-gap energy to a desired energy level that is substantially higher than the cell band-gap energy. These unique features of the hot carrier solar cell 500 of this invention in effect would allow the cell energy extraction efficiency benefits of a multi-junction solar cell from a single junction solar cell at a substantially lower cost.

As illustrated in FIG. 5A, the photovoltage of the hot carrier cell 500 of this invention is made to vary in accordance with the waveform illustrated in FIG. 5B by incorporating either the bias circuits 510 or 520 in series or in parallel, respectively, with the core solar cell element 530. Either of the bias circuits 510 or 520 can be implemented either as an integrated circuit device or a discrete component circuit board that can be integrated with conventional GaAs, CdTe, CIGS or Si based solar cells. In order to cause the photovoltage of the cell to temporally vary as illustrated in FIG. 5B, the bias circuits 510 or 520 would have to cause the effective resistance across the contacts of the core solar cell 530 to also temporally vary in such a way that would cause the photovoltage across the contacts of the core solar cell 530 to follow the waveform illustrated in FIG. 5B. Without loss of generality, the remaining discussion will focus on the detailed description of the series bias circuit 510 since the design of the parallel bias circuit 520 would be substantially similar, albeit with a different set of design parameters. A person skilled in the art can readily utilize the detailed description of the series bias circuit 510 provided herein to select the design parameters of the parallel bias circuit 520.

Figure 5C:
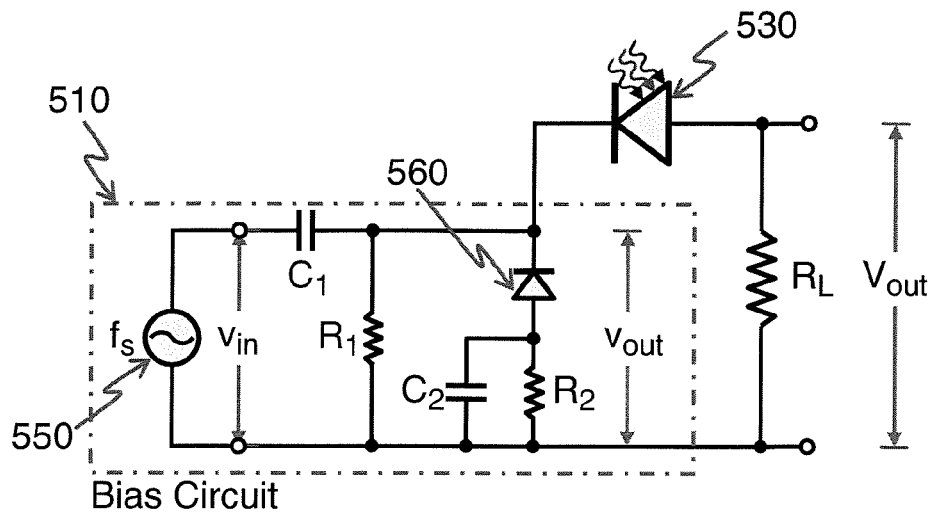
FIG. 5C presents a detailed block diagram of the hot carrier solar cell of this invention.

FIG. 5C illustrates an exemplary detailed block diagram of the hot carrier solar cell 500 of this invention that utilizes the series bias circuit incorporated within the dashed line block 510 in FIG. 5C. FIG. 5C shows the bias circuit 510 connected in series with the core solar cell 530, which can be either a GaAs, CdTe, CIGS or Si based p-n junction solar cell. The bias circuit 510 illustrated in FIG. 5C is basically a temporally varying resistor $R_v$ that is comprised of an oscillator 550, a diode 560 and multiplicity of resistors and capacitors marked accordingly on FIG. 5C. The function of the oscillator 550 is to generate a variable voltage signal $v_{in}$ having a frequency $f_s$ whose value equals the reciprocal value of the desired alternation cycle $T_b$ of the photovoltage $V_{out}$ of the hot carrier solar cell 500 of this invention or $f_s = (T_b)^{-1}$. For the design examples discussed earlier, when the value of $T_b = 2.5$ ns is selected for implementation in a GaAs, CdTe, CIGS or thin-film Si based hot carrier solar cell of this invention, the frequency $f_s$ that needs to be generated by the oscillator 550 would be $f_s = 400$ MHz. For the design example discussed earlier, when the value of $T_b = 15$ ns is selected for implementation of the hot carrier cell 500 of this invention in conjunction with a conventional Si based cell, the frequency $f_s$ that needs to be generated by the oscillator 550 would be $f_s = 66.7$ MHz.

The values of the resistor and capacitor pair $(R_1, C_1)$ together with the (I,V) characteristics of the diode 560 would be selected to realize the maximum and minimum values of the variable resistance $R_v$ needed to create the required maximum and minimum values, respectively, of the photovoltage $V_{out}$ across the contacts of the core solar cell 530. The values of the resistor and capacitor pair $(R_2, C_2)$ together with the (I,V) characteristics of the diode 560 would be selected to realize the ratio $\alpha$ which sets the duty cycle of the sub-interval $(\alpha T_b)$ relative to the cycle duration $T_b$. During one cycle of the voltage $v_{in}$ generated by the oscillator 550, the time variation of the voltage $v_{in}$ will cause the effective resistance across the diode 560 to cyclically change, which will in turn cause the effective resistance $R_v$ of the entire bias circuit 510 to change cyclically as well from a minimum value $R_{vmin}$ to a maximum value $R_{vmax}$. This cyclical change of the effective resistance of the bias circuit 510, when taken into account together with the value of the load resistance $R_L$, will cause the photovoltage $V_{out}$ of the exemplary implementation of FIG. 5C of the hot carrier solar cell 500 of this invention to also cyclically change following the waveform illustrated in FIG. 5B. A person skilled in the art would know that the desired effect of implementing a temporally varying resistor can be realized in many alternative ways other than that described earlier, but the end effect would be the same.

The type of serial bias circuit 510 illustrated in FIG. 5C is similar to those typically used in wireless applications which can be designed to generate modulated signals well within the range of frequencies needed for the implementation of the alternating bias solar cell 500. A person skilled in the art would know that there are many alternative circuit designs other than that illustrated in FIG. 5C that can be used to generate the bias waveform illustrated in FIG. 5B with a comparable end result.

Figure 6:
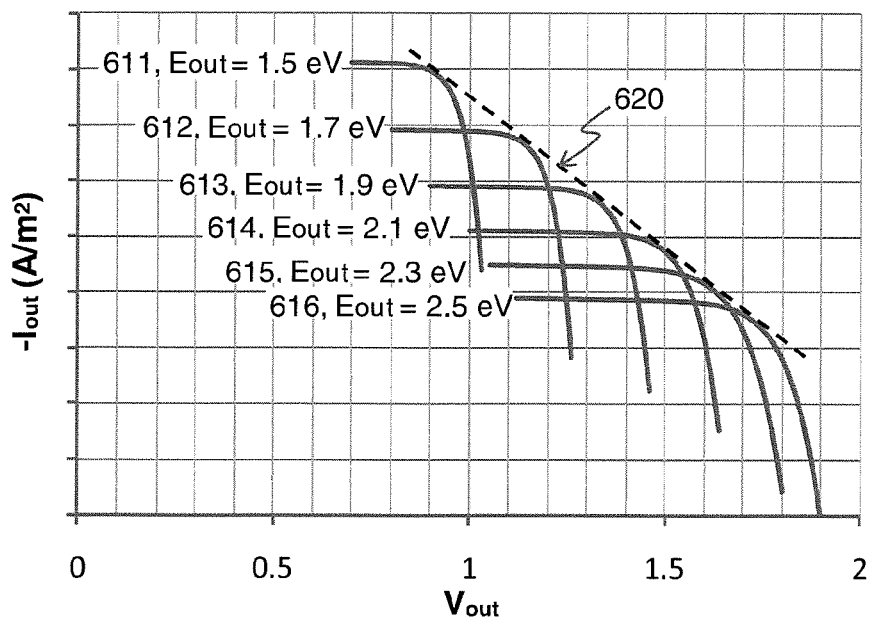
FIG. 6 illustrates the expected (I,V) characteristics of the hot carrier solar cell of this invention.

FIG. 6 is an illustration of the photovoltage and photocurrent (I,V) characteristics expected to be yielded by the hot carrier solar cell 500 of this invention. It should be noted that the photovoltage and photocurrent achieved by the hot carrier solar cell 500 are in actuality the photovoltage and photocurrent provided by the core solar cell 530 when dynamically biased, as explained in the earlier discussion. Referring to FIG. 5C, the photovoltage and photocurrent achieved by the hot carrier solar cell 500 are therefore the voltage across and the current through, respectively, the load resistor $R_L$. As explained earlier, when the photovoltage $V_{out}$ of the hot carrier solar cell 500 of this invention is made to temporally vary following the waveform illustrated in FIG. 5B, the effective extraction energy at the contacts of the core solar cell 530, which will be referred to as $E_{out}$, will also temporally vary following the waveform illustrated in FIG. 5B. FIG. 6 shows a group of curves 611, 612, 613, 614, 615 and 616, each representing the expected (I,V) characteristics that would be yielded by the core solar cell 530 when the extraction energy at its contacts is at the values of $E_{out}$ that ranges from 1.5 eV to 2.5 eV. The expected (I,V) characteristics to be yielded by the hot carrier solar cell 500 of this invention are illustrated in FIG. 6 as the envelope 620 of the group of curves 611, 612, 613, 614, 615 and 616, which represent the photovoltage and photocurrent expected to be achieved by the hot carrier solar cell 500 when the voltage across its core solar cell 530 is swept across a set of values within the range of photovoltage from $V_{min}$ to $V_{max}$.

As illustrated in FIG. 6, the (I,V) characteristics expected to be yielded by the hot carrier solar cell 500 of this invention would extend over a wide range that is enabled by the wide range of extraction energy $E_{out}$ values at the cell 500 contacts that extend from slightly below the band-gap of the core solar cell 530 to the value of $E_{out}$ that corresponds to the maximum photovoltage $V_{out}$ of the hot carrier solar cell 500 that is enabled by the incorporated bias cell 510. For example, since the rate at which the extraction energy $E_{out}$ at the contacts of the hot carrier solar cell 500 is made to vary at a rate that is comparable to or faster than the hot carriers cooling rate, at the instant within the photovoltage variation cycle $T_b$ of the hot carrier solar cell 500 of this invention when the instantaneous value of the extraction energy $E_{out}$ at the contacts of the cell 500 is at 1.7 eV, the photovoltage $V_{out}$ of the cell 500 would be at ~1.15 V with a photocurrent value that represents the number of carriers extracted by the cell 500 which were photo-excited by solar photons at an energy value of $E_{out}$=1.7 eV. Similarly, at the instant when the cell 500 photovoltage $V_{out}$~1.35 V, the value photocurrent of the hot carrier cell 500 would represent the number of carriers extracted by the cell 500 which were photo-excited by solar photons with an energy value at the value of $E_{out}$=1.9 eV, and so on. In effect, the variable bias of the hot carrier solar cell 500 of this invention would enable the cell to extract carriers photo-excited by solar photons with energy that extends over a wide range and before the energy of these photo-excited carrier is lost due to the carrier cooling effect, thus allowing the hot carrier cell 500 of this invention to yield values of photovoltage and photocurrent, represented by the envelope 620, that are substantially higher than what would be offered by the core cell 530 standalone operating at a static (fixed) conventional bias value.

Figure 7A:
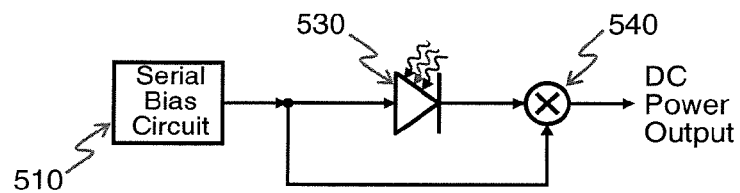
FIG. 7A presents an exemplary block diagram of the hot carrier solar cell of this invention having a direct current (DC) output.

As explained earlier, the photovoltage and photocurrent of the hot carrier solar cell 500 of this invention will temporally vary at a profile that is substantially comparable to the waveform illustrated in FIG. 5B. In order to make use of the variable output of the hot carrier solar cell 500, its output will have to be converted either to DC or AC format. The conversion of the hot carrier solar cell 500 of this invention to DC format can be accomplished by mixing the photovoltage $V_{out}$ of the hot carrier solar cell 500 with the output $v_{out}$ of the bias circuit 510 in order to down convert it to baseband in very much the same way as the down conversion of the signal received by a radio is converted from radio frequency (RF) band to baseband. This can be accomplished, as illustrated in FIG. 7A, by adding the mixer 540 at the output of the hot carrier solar cell 500. The overall configuration of the hot carrier cell of this invention, which is now designated as 700 in FIG. 7A, will then be comprised of the core solar cell 530 with the bias circuit 510 connected in series with it and the mixer 540 connected at their collective output. It should be noted that the overall configuration of the hot carrier cell 700 of this invention can equivalently be implemented using the bias circuit 520 connected in parallel with the core solar cell 530 as illustrated in FIG. 5A.

Figure 7B:
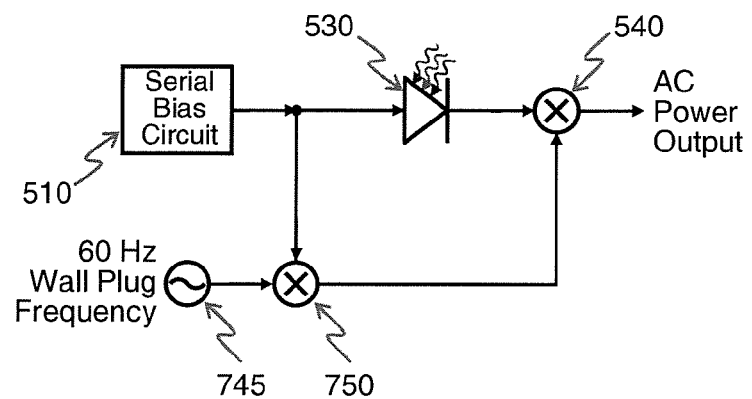
FIG. 7B illustrates an exemplary block diagram of the hot carrier solar cell of this invention having an alternating current (AC) output.

Alternatively the output of the hot carrier solar cell 700 of this invention can be converted to AC format, as illustrated in FIG. 7B, by first mixing the output $v_{out}$ of the bias circuit 510 with an oscillator signal having the same frequency as the desired AC format then further mixing the mixed version of the output $v_{out}$ with the photovoltage $V_{out}$ of the hot carrier solar cell 500 in order to down convert it to the desired frequency of the AC format. For example, if it is desired to make the output of the hot carrier solar cell 700 of this invention be in 60-Hz AC format, the output $v_{out}$ of the bias circuit 510 will first be mixed with the output signal of a 60-Hz oscillator 745 using the mixer 750 then the resultant signal is further mixed using the mixer 540 with output $V_{out}$ of the hot carrier solar cell 500 to produce 60-Hz AC format output from the overall hot carrier solar cell 700. This unique feature of the hot carrier solar cell 700 which allows its output to be converted to either AC or DC format is enabled by the alternating bias aspects of the hot carrier solar cell 500. It is worth noting that the difference between the mixing circuits included in the configurations of FIG. 7A and FIG. 7B of the hot carrier solar cell 700 to make its output either DC or AC, respectively, is not significant in complexity. Which in turn implies that the DC and AC configurations of FIG. 7A and FIG. 7B of the hot carrier solar cell 700 can be made to have substantially the same cost and achieve substantially the same solar power conversion efficiency. This is a substantial differentiation of the hot carrier solar cell 700 of this invention when compared to today's conventional solar cells which typically require inverters to convert its DC output to AC with an added cost plus a 25% reduction in the overall cell efficiency.

Figure 7C:
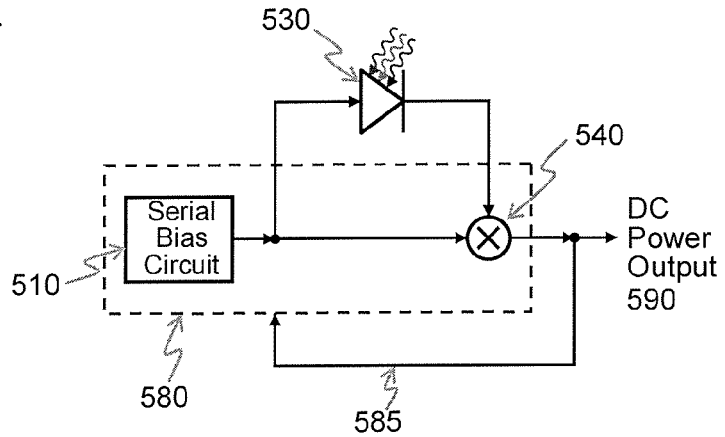
FIG. 7C illustrates an exemplary block diagram of the self biased hot carrier solar cell of this invention.
Figure 7D:
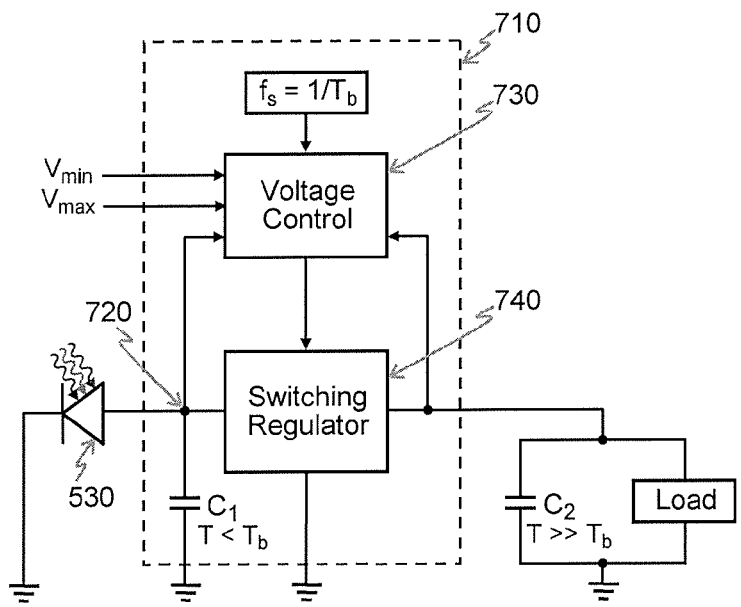
FIG. 7D represents an exemplary block diagram of an alternate hot carrier solar cell of this invention having a direct current (DC) output.

Another biasing scheme that might be used is shown in FIG. 7D, which illustrates both the desired object and a desired result. As shown therein the core solar cell 530 is connected between ground and an output circuit 710 which in turn is connected to a Load. The output circuit 710 comprises a high frequency form of Switching Regulator 740 having, among other things, a Voltage Control 730 to control the ($V_{min}$, $V_{max}$) voltage values that control the switching of the Switching Regulator 740 so that it presents a variable non-dissipative load (except for normal circuit losses) on the core solar cell 530 (an inductor temporarily coupled between the output of the core solar cell and the circuit ground, which inductor is then switched to the circuit output to recover the magnetic energy temporarily stored in the inductor) and provides a DC output. In particular, while most switching regulators typically control the switching to provide a regulated voltage output to a load, regardless of changes in the load, the Switching Regulator 740 of FIG. 7D is controlling the voltage at its input (i.e., at the output of the core solar cell 530) so that the voltage at the output of the core solar cell 530 swings between $V_{min}$ and $V_{max}$ at the desired frequency. This may be achieved by one skilled in the art by control of the switching duty cycle, switching frequency or a combination of these or other parameters.

For the voltage swing to $V_{max}$, note that $V_{max}$ will be a higher voltage than the open circuit voltage of the core solar cell, so that the Voltage Control 730 that controls ($V_{min}$, $V_{max}$) needs to have the capability of pulling $V_{max}$ to a voltage above the open circuit voltage of the core solar cell. Thus in FIG. 7D, the Voltage Control 730 that controls ($V_{min}$, $V_{max}$) not only senses the voltage at the node 720, but also has the capability of pulling the voltage at node 720 up beyond the voltage it would tend to reach by itself. The impedance at the node 720 for the pull-up is expected to be very high, as the core solar cell 530 is still outputting current at the higher voltages. In that regard, $V_{max}$ may be set at a voltage above which the power required to raise the voltage on node 720 exceeds the power being recovered from the core solar cell 530, unless for some reason it is found that some higher value of $V_{max}$ is useful. It is also possible that $V_{max}$ should be set at a voltage somewhat below the voltage for which the power required to raise the voltage on node 710 equals the power being recovered from the core solar cell 530, as the overall consideration is the total solar cell system efficiency, not the efficiency of some small part of the system. The small amount of power for the pull-up may be taken from the output to the Load, as shown in FIG. 7D.

In increasing the voltage at the node 720 toward $V_{max}$, the switching Regulator 740 would be relatively inactive, or perhaps totally inactive, with the ramp up to $V_{max}$ being controlled primarily by the output of the core solar cell 530, the value of capacitor $C_1$ and the pull-up at node 720, with the Switching Regulator 740 then becoming more active to transfer the charge from capacitor $C_1$ through the Switching Regulator 740 to the Load and output capacitor $C_2$ faster than charge is added to the capacitor $C_1$ by the core solar cell 530, causing the voltage on capacitor $C_1$ to decrease to $V_{min}$, after which the cycle repeats. In the limit, the voltage swing from $V_{max}$ to $V_{min}$ could be achieved in a single switching cycle of the Switching Regulator 740, with adjustments being made cycle to cycle to maintain the desired accuracy in $V_{min}$. This would minimize the frequency requirements of the switching regulator, with the wave shape of the voltage between $V_{max}$ and $V_{min}$ being controlled, at least in part, by the value of capacitor $C_1$. In FIG. 7D, an input to the Voltage Control 730 is shown to be $f_s=1/T_b$ (see FIGS. 5B and 6). The actual switching frequency may be $f_s$ or may be higher, depending on the operation of the system. Also $V_{max}$ and $V_{min}$ could be programmable or self adapting to adjust for the characteristics of the light incident on the core solar cell—morning, mid-day, evening, sunny, overcast, artificial light, etc.

In FIG. 7D, the Switching Regulator 740 controls the voltage on capacitor $C_1$ to achieve $V_{min}$ and $V_{max}$ at the desired frequency. Consequently the DC voltage on the Load is not regulated by this circuit, but would be effectively regulated by a circuit connected thereto, such as an inverter, to convert the DC voltage on the Load to 60 Hz for coupling to the power distribution system. Also the Switching Regulator 740 may be a step up, step down or step up/step down regulator, as desired. Such switching circuits are well known in the prior art and need not be further described herein.

Performance of the Alternating Bias Hot Carrier Solar Cell

Figure 8:
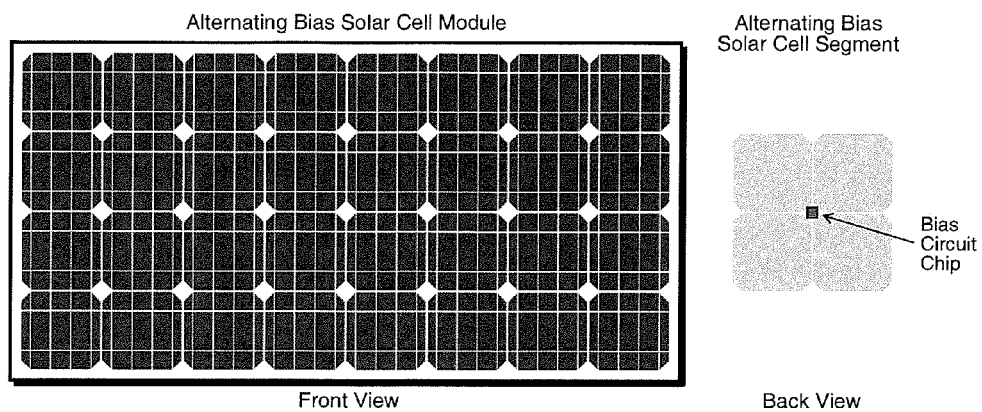
FIG. 8 illustrates an exemplary implementation of the alternating bias hot carrier solar cell of this invention.

In order to analyze the performance of the embodiment 700 of the hot carrier solar cell of this invention, certain design parameters and implementation details will have to be taken into account. The first of such details is the approach used to implement the bias circuit 510 or 520 and the mixer circuit 540 and how these circuits are to be integrated with the core solar cell element 530 of the hot carrier solar cell 700. FIG. 8 illustrates an exemplary implementation of the hot carrier solar cell 700 of this invention in which the bias circuit, either 510 or 520, and the mixer circuit 540 are implemented as an integrated circuit (IC) device which is bonded to the backside of the solar cell module. Since the hot carrier solar cell 700 includes additional circuits other than the core solar cell 530, namely, either the bias circuits 510 or 520 and the mixer circuit 540, which will consume some of the power that would be generated by the cell, the efficiency of the hot carrier solar cell 700 must be assessed in terms of its resultant expected power-added efficiency PAE (PAE is a term adopted from RF circuit design according to which the PAE of an RF circuit which achieves an input to output amplification gain is the difference between the input and output powers of the circuit divided by the supply power), which can be expressed as:

$$PAE = \eta(IL_M) - (P_{LO} + P_M)/P_L \quad \text{Eq. 1}$$

Where, $\eta$ is the solar power conversion efficiency that can be achieved by the hot carrier solar cell 700;

$IL_M$ is the insertion loss of the output mixer 540 expressed as output-to-input power ratio;

$P_{LO}$ is the power consumed by the bias circuit 510 or 520;

$P_M$ is the power consumed by the mixer circuit 540; and $P_L$ is the radiant power of the solar radiation incident on the hot carrier solar cell 700.

The values of $IL_M$ and $P_M$ are dependent on the design approach and the power level handled by the output mixer 540 of the hot carrier solar cell 700. In order to quantitatively analyze the efficiency of the hot carrier solar cell 700 as expressed by Eq. 1, it is assumed that the bias circuit 510 and output mixer circuit 540 illustrated in FIG. 7A are designed to drive a 100 cm² sub-cell area of the core solar 530. It should be noted that an arbitrary size of the hot carrier soar cell 700 can be created using multiple such sub-cells as illustrated in FIG. 8, each with its own core circuit, with their output combined to provide a single output, either in AC or DC format. For the assumed sub-cell size, the radiant power of AM1.5 solar flux incident of the assumed sub-cell area would be $P_L=10$ W. With such a level of solar incident light radiant power and an expected solar power conversion efficiency for the hot carrier solar cell 700 of $\eta=0.54$, the expected power at the input of the mixer 540 would be in the range of 5.4 W. It should be noted for the purpose of this performance analysis example, although the theoretically predicted efficiency of hot carrier solar cells can reach the thermodynamic limit of 68% under 1-sun, in order to allow for an implementation loss margin the expected value of the efficiency that the hot carrier solar cell 700 would achieve is conservatively selected to be less than 80% of the predicted theoretical limit for the efficiency of a hot carrier solar cell.

Based on these expected values, a 0.18 micron CMOS integrated circuit implementation of the bias circuit 510 and the mixer circuit 540 is estimated to be able to conservatively achieve the following performance parameters:

$IL_M=0.95$;

$P_{LO}=108$ mW;

$P_M=270$ mW; and $P_L=10$ W.

When the above values are used in Eq. 1, the power-added efficiency (PAE) estimate for the hot carrier solar cell 700 used in our benchmark design example is PAE=0.47, which is more than double the efficiency of a typical conventional core solar cell 530 that would be used to implement the hot carrier solar cell 700.

In taking into account the assumed efficiency of the hot carrier solar cell 700 of η=0.54, this benchmark design example implies that the additional circuit used to generate the alternating bias and convert the output of the hot carrier solar cell 700, whether to AC or DC, would consume approximately 12% of the cell output power. It should be noted that conventional solar cells lose more than 25% of their yielded power to the DC/AC inverter typically used at their output, yet the hot carrier solar cell 700 of this invention would only lose less than half that percentage to its bias and mixer circuits, but would still enable more than double the raw efficiency before the DC/AC inverter of the conventional core solar cell 530 used to implement the hot carrier solar cell 700 operating with a fixed bias. Meaning based on a comparison at the AC output, the hot carrier solar cell 700 would likely achieve an overall solar power conversion efficiency that will be almost 2.7× that of a conventional solar cell with an AC/DC inverter at its output.

It should be noted that with the above estimated level of power-added efficiency, a self-biasing scheme of the hot carrier solar cell 700 would also be feasible. In such a self-biasing scheme, which is illustrated in FIG. 7C, the hot carrier solar cell 700 would not require any additional power to be supplied in order to be initialized and would initially operate in a non-alternating (fixed) bias mode with a small portion of its generated energy being used to initialize its alternating bias and mixer circuits. As illustrated in FIG. 7C, the power output of the hot carrier solar cell 700 will be used to provide supply power to bias circuit 510 and the mixer circuit 540, which are shown in FIG. 5C collectively enclosed in the dashed box 580 with their power supply line 585 being provided from the solar cell output power 590. As soon as the bias circuit 510 and mixer circuit 540 reach steady state (which would be less than a millisecond), the alternating bias mode of operation of the hot carrier solar cell 700 of this invention is expected to more than double the output power yielded by the conventional core solar cell 530 used to implement the hot carrier solar cell 700.

Cost Considerations

The alternating bias and mixer circuits described in the previous discussion are estimated to require ~1 mm² of die area using 0.18 CMOS technology. In order to reduce the packaging overhead cost that would be associated with such a small die size, the bias and mixer circuits of four of the sub-cells illustrated in FIG. 8 can be readily combined onto a single chip, which would be placed on the backside at the center of each four (Quad) sub-cells. Such a chip is estimated to have ~4 mm² of die area using 0.18 micron CMOS technology with an estimated unpackaged die cost ~$0.19/die. The packaged cost of this quad bias & mixer chip is conservatively estimated to be in the range of 5× the die cost, which would lead to an estimated cost per quad bias & mixer chip of ~$1. This estimate is most likely on the conservative side, especially when low-cost packaging techniques such as glop-top are used to integrate the quad bias & mixer chip directly on the backside of the hot carrier solar cell 700 sub-cell as illustrated in FIG. 8. In taking into account the estimated output power yielded by the hot carrier solar cell 700 quad sub-cell based on the design example described earlier, the addition of the quad bias & mixer chip would result in a cost-per-watt offset of $\delta W_p$~$0.05/W—meaning that 25 of the quad bias & mixer chips would be used per square meter for an added cost of ~$25/m² with an estimated net yielded output power from a Si-based hot carrier solar cell of ~475 W/m². In taking into account that the prevailing cost-per-watt for Si solar cells is in the range from $W_p$~3-5$/W, the estimated cost offset of converting a conventional Si solar cell into the Si-based hot carrier solar cell 700 is estimated to be in the range from 1% to 1.6% of the current value of the cost-per-watt $W_p$ for Si solar cells, which for all practical purposes is negligible. In taking into account the increase in the power output that can be realized by the hot carrier solar cell 700, the estimated cost-per-watt of a hot carrier solar cell 700 that incorporates a Si solar cell as its core element 530 would be in the range $(W_p)$~1-1.7$/W, which reflects a per watt cost reduction of more than 3×. At this scale of cost-per-watt offset $\delta W_p$ and efficiency increase, it is expected that the hot carrier solar cell 700 of this invention that uses a thin-film type solar cell; for example CdTe, CIGS or thin-film Si, as a core solar cell 530 can achieve a cost-per-watt $W_p$ that is well below 1 $/W and possibly in the range of $W_p$~0.3 $/W, which is well within the range set forth for the 3$^{rd}$ Generation solar cell.

Reverse Bias Hot Carrier Solar Cell

The embodiment 700 of the alternating bias hot carrier solar cell 500 described in the previous discussion relies on cyclically lowering the photovoltage output of the cell in order to instantaneously cause an increase in the transport velocity of the photo-excited carriers. An alternative approach that would achieve a comparable effect, yet in a different way, would be to intermittently apply an external reverse bias at the cell contacts for a sufficiently short time interval. The intermittent application of a short reverse bias pulse would introduce an additional external electric field $\epsilon_{ext}$ across the cell contact that will actually act to enforce the built-in field of the cell. The result would be that these reverse bias pulse intervals will cause the transport velocity photo-excited carrier to instantaneously increase above the saturation velocity of the cell material, and depending on the amplitude of the applied reverse bias pulses, the photo-excited carriers transport velocity could reach ballistic overshoot level. This alternative embodiment of the hot carrier solar cell 500 of this invention would use the parallel bias 520 to generate the reverse bias pulses that would achieve substantially shorter photo-excited carriers transport time to the cell contacts. In addition, this alternative embodiment of the hot carrier solar cell 500 of this invention would simultaneously also use the series bias circuit 510, but in this case to sustain a high transport velocity, albeit lower than the transport velocity during the duration of the applied reverse bias, and to also implement the temporally selective extraction energy scheme described earlier within the context of the embodiment 500 and 700. The primary features of this alternative embodiment of the hot carrier solar cell 500 of this invention are that it allows the decoupling of the carrier transport and carrier extraction energy aspects of the hot carrier solar cell 500 of this invention. With the decoupling of these two aspects of the hot carrier solar cells of this invention it becomes possible to sustain a time continuous high value of carrier transport velocity by appropriately selecting the intermittence cycle of the applied reverse bias pulse while being able to independently select the appropriate value for the cycle of variability of the cell photovoltage that enables the temporally energy selective scheme of the hot carrier solar cell 500 and 700 to be able to timely extract the photo-excited carriers at the cell contacts before they cool down.

Figure 9A:
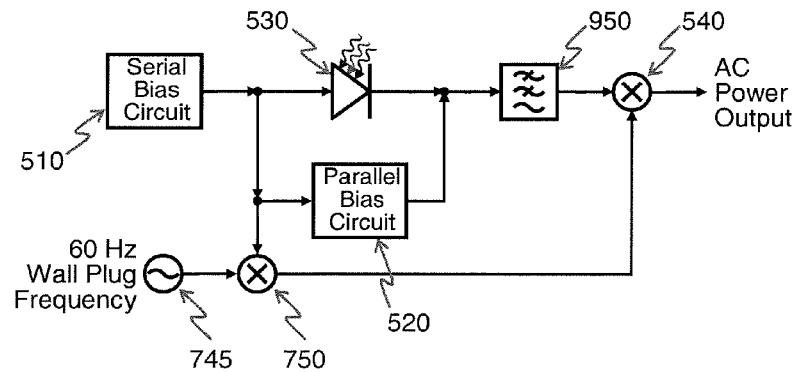
FIG. 9A presents a high level block diagram of an alternative embodiment the hot carrier solar cell of this invention.

FIG. 9A illustrates the block diagram of an alternative embodiment of the hot carrier solar cell 500, which is now referred to as 900, that uses a parallel bias circuit 920 to generate a stream of short duration reverse bias pulses across the contacts in addition to a series bias circuit 910, similar to the bias circuit 510, that causes the resistance across the cell 900 contacts, and thus the photovoltage output value of the hot carrier cell 900, to cyclically vary between a minimum value $V_{min}$ and a maximum value $V_{max}$ in a substantially similar way as in the embodiment 700 described earlier. The effect of the variable bias introduced by the series bias circuit 910 would be to enable the hot carrier solar cell 900 to extract the hot carriers at its contact at a wide range of extraction energy $E_{out}$ that will extend from slightly below the cell bandgap energy of its core solar cell element 530 up to the maximum desired energy level that would be enabled by the maximum value of the photovoltage enabled by the bias circuit 920. In the case of the hot carrier 900 of this invention, the waveform of the photovoltage would no longer include the two sub intervals $\alpha T_b$ and $(1-\alpha)T_b$ that were explained earlier, but instead only the cycle time $T_b$ of the intermittent change of the cell photovoltage output will need to be comparable or shorter in duration than the carrier cooling time $\tau_c$.

Figure 9B:
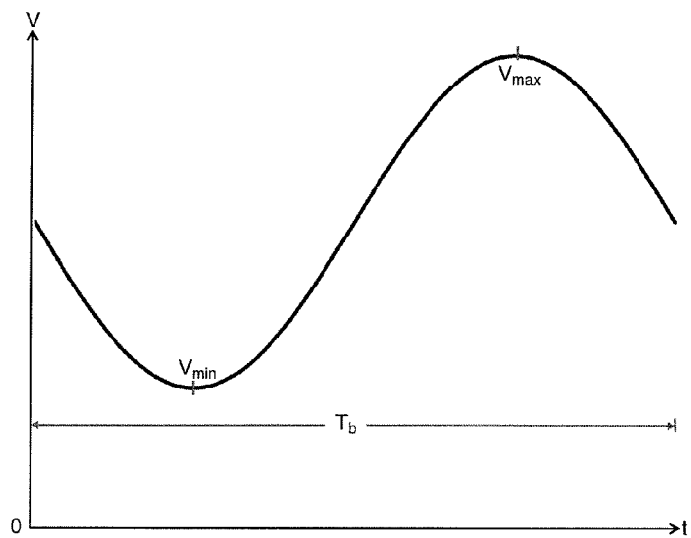
FIG. 9B illustrates the waveform of the photovoltage of the alternating serial bias of the alternative embodiment of the hot carrier solar cell of this invention.

FIG. 9B illustrates the waveform of the photovoltage of the hot carrier solar cell 900 which shows that the waveform can be a simple sinusoidal waveform, for example, with its minimum value $V_{min}$ and maximum $V_{max}$ values selected as specified earlier. With the decoupling of the carrier transport acceleration and the temporally selective energy carrier extraction aspects, the cycle time $T_b$ of the intermittent change of the cell photovoltage of the hot carrier solar cell 900 can be made even shorter than that for the hot carrier solar cell 500 and 700. With $T_b$~1 ns, the extraction energy $E_{out}$ of the hot carrier solar cell 900 would change at a rate that would be even faster than the carrier cooling rate in some solar cell material systems. In order to realize $T_b$~1 ns, the frequency of the oscillator included in the bias circuit 910 will be $f_s$~1 GHz.

Although the temporally varying photovoltage created by the series bias circuit 910 will still create the carrier transport acceleration effect described earlier, a major part of the carrier transport acceleration effect in the hot carrier solar cell 900 would be accomplished by the parallel bias circuit 920. The parallel bias circuit 920 will create very short and periodic reverse bias pulses across the core solar cell element 530. The waveform of the bias that will be generated by the parallel circuit 910 and applied across the core solar cell element 530 is illustrated in FIG. 9B. The waveform illustrated in FIG. 9B is basically a periodic stream of short pulses of reverse bias each with a time duration $t_p$, a pulse repetition cycle $T_p$ and an amplitude $V_p$. When each of the pulses generated by the parallel bias circuit 920 is applied at the contact of the core solar cell 530, it will cause an external electric field $\epsilon_{ext}$ that is in the same direction as the built-in electric field $\epsilon_{bi}$ of the core solar cell 530, thus actually enhancing the effect of the built-in electric field $\epsilon_{bi}$ in transporting the electrons to the cell negative contact and the holes to the cell positive contacts. The possible range of the values of $V_p$ relative to the (I,V) characteristics of a conventional solar cell is illustrated in FIG. 4 with reference number 425.

During the time duration $t_p$ of the reverse bias generated by the parallel bias circuit 920, the carriers will be transported toward the contacts of the core solar cell 530 under the combined cooperative effect of the two electric fields $\epsilon_{bi}$ and $\epsilon_{ext}$ acting in the same direction to transport the electrons toward the negative contact and the holes toward the positive contact of the hot carrier solar cell 900. The first, and major, difference between the internal built-in electric field $\epsilon_{bi}$ of the core solar cell 530 and the external field $\epsilon_{ext}$ caused by the applied reverse bias pulses generated by the parallel bias circuit 920 is that this external electric field $\epsilon_{ext}$ will extend cross the full thickness of the cell from contact to contact rather than being present primarily within the core solar cell 530 depletion region thickness. The second difference between the internal built-in electric field $\epsilon_{bi}$ of the core solar cell 530 and the external field $\epsilon_{ext}$ caused by the applied reverse bias pulses generated by the parallel bias circuit 920 is that the intensity of the external electric field $\epsilon_{bi}$ can be set to the appropriate level needed to create the desired carrier acceleration effect. Furthermore, since the external electric field $\epsilon_{ext}$ is applied periodically for a short time interval, the amount of power that would be consumed by the circuit that generates it, namely, the parallel bias circuit 920 would be very small.

During the reverse bias pulse duration $t_p$ both the internal $\epsilon_{bi}$ and external $\epsilon_{ext}$ electric fields will be acting in the same direction and will both contribute to the transport of the photo-excited carriers toward the contacts of the core solar cell 530. With the appropriate selection of the amplitude $V_p$ of the applied reverse bias pulse, the combined strength of internal $\epsilon_{bi}$ and external $\epsilon_{ext}$ electric fields can be made to cause the carrier transport velocity to reach ballistic overshoot velocity, which is typically much greater than $10^7$ cm/s, during the pulse duration $t_p$ but will decay rapidly to the saturation velocity level of ~$10^7$ cm/s. When reverse bias pulse amplitude $V_p$, duration $t_p$ and repetition cycle $T_p$ are selected appropriately (for example $V_p$~1V, $T_p$~1 ns, and $t_p$~0.1 $T_p$) the carrier transport velocity across the core solar cell 530 can be sustained continuously very close to the saturation velocity of ~$10^7$ cm/s. That means that the photo-excited carriers transport toward the contacts of the core solar cell 530 can be continuously sustained close to 100 μm in 1 ns, which would allow photo-excited carriers generated within a thin core solar cell 530 (such as CdTe, CIGS or Thin-Si) with contact-to-contact thickness of 5 μm to be able to reach the cell contacts within 25 ps, which is sufficiently shorter than the hot carrier cooling time $\tau_c$ of most solar cell materials. These combined features of the hot carrier solar cell 900 would also make it possible to apply in a conventional Si solar cell with typical contact-to-contact thickness ~300 μm with the realized carrier transport time in this case of ~1.5 ns, which is also sufficiently shorter than the hot carrier cooling time $\tau_c$ of the Si material.

Figure 9C:
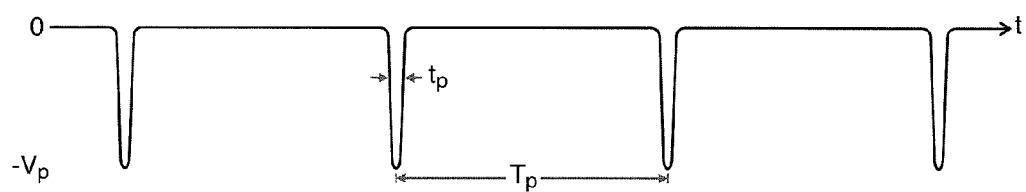
FIG. 9C illustrates the waveform of the photovoltage of the pulsed parallel bias of the alternative embodiment of the hot carrier solar cell of this invention.
Figure 9D:
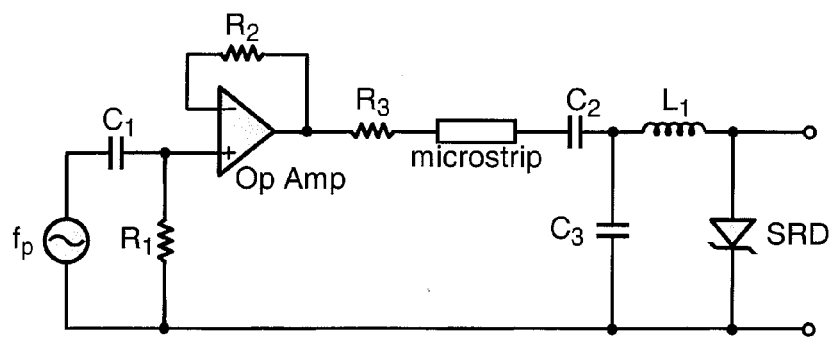
FIG. 9D presents a typical block diagram of the parallel bias circuit of the alternative embodiment of the hot carrier solar cell of this invention.

With collective bias generated by the serial and parallel bias circuits 910 and 920, respectively, the hot carrier solar cell 900 can transport the photo-excited carriers to the contacts of the core solar cell 530 well before the carriers cool down and have these carriers extracted at a temporally varying selective extraction energy also before they cool down at the cell contacts. The serial bias circuit 510 block diagram used in the hot carrier solar cell 900 is substantially similar to that of the serial bias circuit 510 referenced in FIG. 5C. FIG. 9D illustrates a typical block diagram of the parallel bias circuit 520 that can be used in conjunction with the embodiment 900 of the hot carrier solar cell 500 of this invention. The type of circuit illustrated in FIG. 9D is similar to those typically used in ultra wideband wireless applications and can be designed to generate pulses of fewer than picoseconds in duration with a repetition interval smaller than one nanosecond. Such design parameters can readily be applied to generate the reverse bias waveform illustrated in FIG. 9C. A person skilled in the art would know that there are many alternative circuit designs other than that illustrated in FIG. 9D that can be used to generate the reverse bias waveform illustrated in FIG. 9C with a comparable end result.

As illustrated in FIG. 9A, similar to the hot carrier solar cell 500, the ultimate output of the hot carrier solar cell 900 would be down converted either to DC or AC format by mixing the output of the serial bias circuit 910 with the cell output across the load resistor $R_L$ except that in the case of the embodiment 900, the low pass filter 950 will have to be added to remove the applied wideband spectrum of the reverse bias from the output of the cell 900 prior to the down conversion accomplished by a mixer circuit 540. Although FIG. 9A illustrates the hot carrier solar cell 900 configuration that provides AC output, a configuration of the hot carrier solar cell 900 can readily be realized to provide DC output by eliminating the 60-Hz oscillator 745 and the mixer 750 from the block diagram of FIG. 9A.

In reference to the earlier discussion on the loss mechanisms in solar cells, the hot carrier solar cells 500, 700 and 900 of this invention achieve yielded net efficiency increase by circumventing two major loss mechanisms; namely, loss mechanism ❷, hot carrier cooling, and loss mechanism ❺, contact extraction efficiency. The discussion in the following section is intended to show that when the alternating bias scheme of this invention is implemented in conjunction with core solar cells incorporating quantum confinement structures, such as QWs or QDs, the resultant hot carrier solar cell would be able to achieve a still higher yielded net efficiency increase by circumventing another one of the major loss mechanisms, namely, loss mechanism ❶, the loss of photons with $E_p < E_g$, plus loss mechanism ❸, the loss of photo-excited carriers due to radiative recombination. As will be explained in a later discussion, the hot carrier solar cells 500, 700 and 900 that use a core solar cell 530 that incorporates both optical and quantum confinement structures are likely to achieve yielded net efficiency that would surpass that achieved by multi-junction solar cells, thus indirectly avoiding loss mechanism ❹ by avoiding the need for monolithic multi-junction staking and the lattice mismatch issue associated with it altogether—the main instigator of loss mechanism ❹.

Extended Coverage Alternating Bias Hot Carrier Solar Cells

Having described in the previous discussion multiple embodiments of the alternating bias hot carrier solar cell of this invention that use p-n junction solar cells such as Si, GaAs, CdTe and CIGS as its core solar cell 530, the discussion in this section is aimed toward extending the capability the alternating bias solar cell of the invention to also harvest the energy of incident solar photons with energies $E_p$ below the cell band-gap $E_g$. The path to achieve this objective is to apply the alternating bias solar cell of this invention in conjunction with III-V material solar cells incorporating quantum confinement structures such as QWs and QDs. This is an attractive application of the alternating bias solar cells of this invention because the versatile material band-gap options of III-V alloys plus their direct band-gap and high carrier mobility when combined with the alternating bias scheme of this invention could lead to a single junction solar cell that would have an extended coverage of the solar spectrum and offer extremely high yielded net efficiency. Although the following discussion will be limited to MQW based solar cells, other than the effects of the extra dimension of quantum confinement, the underlying concepts behind a QD based alternating bias hot carrier solar cell are substantially similar.

Photovoltaic (PV) solar cells that use quantum confinement structures such as QWs and QDs have been extensively studied, but even though they are predicted to achieve efficiency enhancement due to extending the solar photon absorption below the intrinsic cell band-gap ("Quantum Well Solar Cells", K. W. J. Barnham et al, Physica E14 (2002) 27-36), they are yet to gain wide use in comparison to bulk material solar cells, mostly because of the imbalance between their predicated efficiency enhancement and the increase in the cell cost. This imbalance is caused by the fact that quantum confinement based solar cells band-gap extension would mostly be at the lower energy side of the band-gap, thus only increasing the cell photon absorption capability toward the longer wavelength. In addition, the width of the achieved cell band-gap extension would be highly dependent on the material system used and the band-gap structure of the incorporated quantum structure. However, as discussed earlier, the incorporation of quantum structures within the solar cell would offer the ability to slow down the cooling (extending the cooling time $\tau_c$) of hot carriers in III-V material alloy systems. The resultant prolonged carrier cooling time $\tau_c$ in solar cells that incorporate quantum structures makes it more feasible to apply the alternating bias scheme of this invention to III-V material based solar cells since the carrier cooling time in such materials is typically shorter than that in Si, CdTe or CIGS material systems. The benefits of applying the alternating bias hot carrier extraction scheme of this invention of enabling the extraction of photo-excited carries with energy extending beyond the cell material band-gap $E_g$ will equally apply to III-V material based solar cells that incorporate quantum structures. The combined effect of the incorporated quantum structures extending the photo-excited carrier energy extraction below the cell material band-gap $E_g$ and the alternating bias of this invention extending the photo-excited carrier energy extraction above the cell material band-gap $E_g$ would result in a solar cell that would have an extended coverage that could possibly span a substantial portion of the solar spectrum. For example when the alternating bias scheme of this invention is applied in conjunction with a GaAs based solar cell that incorporates quantum confinement structures such as QWs or QDs, the photo-excited carrier extraction of the resultant hot carrier solar cell of this invention can be made to extend well below and above the band-gap energy value of $E_g$=1.42 eV of GaAs.

Figure 10A:
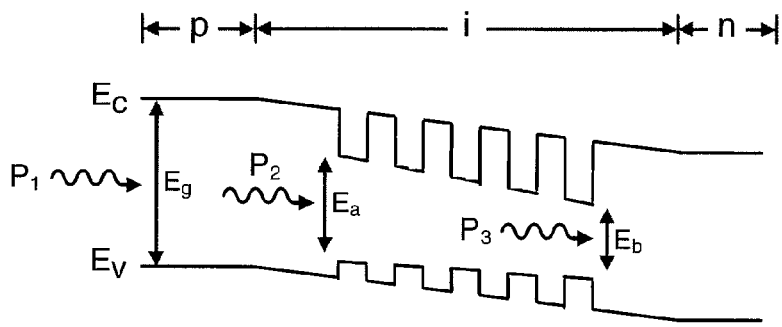
FIG. 10A illustrates the energy band structure of the core solar cell of the hot carrier solar cell of this invention that incorporates quantum confinement means.

The alternating bias scheme of this invention, described in the previous discussion, can be applied in conjunction with a MQW-based solar cell in very much the same way as the embodiments 500, 700, or 900 with the core solar cell 530 being a III-V material based solar cell that incorporates quantum confinement structures such as QWs or QDs. The energy band structure of such a core solar cell 540 is illustrated in FIG. 10A, which shows MQWs being incorporated within the intrinsic region of a p-i-n junction solar core solar cell ("Quantum Well Solar Cells", K. W. J. Barnham et al, Physica E14 (2002) 27-36). The incorporated MQWs would be designed to extend the cell energy extraction capabilities below the cell material band-gap energy $E_g$. This would be accomplished by tapering (grading) the band energy of the MQWs to provide a wide coverage of the energy bands below the cell band-gap $E_g$. What is meant by graded MQWs is illustrated in FIG. 10A, which shows the band-gap associated with each of the incorporated QWs having a different value spanning from Ea to Eb, both of which are below the cell material band-gap $E_g$. The range of energy levels from Ea to Eb can be viewed as an extension of the photon energy absorption capability of the cell below the intrinsic band-gap energy $E_g$. Meaning it would enable photo-excitation of carriers by incident solar photons with energies within the range from Ea to Eb, below the cell band-gap energy $E_g$. In effect, this approach substantially overcomes the cell efficiency loss mechanism ❶ explained earlier, as it would allow the cell to convert the energy of incident solar photons at or below the cell band-gap $E_g$. A detailed explanation of this effect is provided in the discussion below.

Figure 10B:
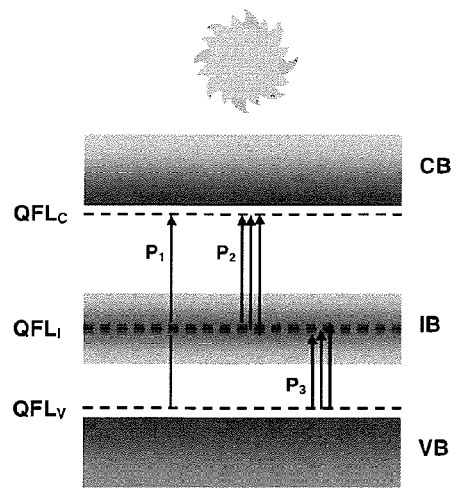
FIG. 10B illustrates the intermediate bands of the core solar cell of the hot carrier solar cell of this invention that incorporates quantum confinement means.

An illustration of the energy band structure of the MQW-based alternating bias hot carrier cell under illumination is shown in FIG. 10B. Under illumination, the band structure of the MQW-based alternating bias hot carrier cell can be described by at least three quasi-Fermi levels (QFLs) ("Detailed Balance Efficiency Limits with Quasi-Fermi Level Variations", S. P. Bremner, R. Corkish and C. B. Honsberg, IEEE Trans. Electron Devices, vol. 46, No. 10, October 1999; A. Luque and A. Marti, Ultra-high efficiency solar cells: the path for mass penetration of solar electricity, Electronics Letter, vol. 44, No. 16, July 2008):

$QFL_V$, which describes the population of holes in the cell valance band (VB);

$QFL_I$, which describes the population of the electrons and holes (carrier pairs) in the intermediate band (IB) formed by the graded MQWs; and $QFL_C$, which describes the population of electrons in the conduction band (CB) of the cell.

Multiple solar photon absorption with energies at or below the cell material band-gap $E_g$, designated in FIG. 10A as $P_1$, $P_2$ and $P_3$, respectively, will enable the following multiple carrier transitions between the multiple QFL separation created, illustrated in FIG. 10B, by the graded MQWs:

VB⇨CB VB⇨IB IB⇨CB

When the alternating bias is used with the hot carrier solar cells 500, 700 or 900 that incorporate a quantum confinement based core solar cell 530, the carriers produced by the "extra" low energy photons $P_2$ and $P_3$ absorbed by the graded MQWs illustrated in FIG. 10A will be extracted and contribute "extra" current. This extra current comes from the extended absorption of photons at lower energy (relative to the cell band-gap) and also from the increased carrier population due to the effect of the quantum confinement in the graded MQWs ("Quantum Well Solar Cells", K. W. J. Barnham et al, Physica E14 (2002) 27-36). The primary difference in this case will be that the temporally varying photovoltage of the hot carrier solar cells 500, 700 and 900 of this invention will also be extended in its $V_{min}$ to provide the lower extraction energy at the contact needed to extract the photo-excited carriers having energy below that of the core cell 530 material band-gap energy $E_g$. An added advantage of this embodiment of the alternating bias hot carrier solar cell of this invention is that the alternation of the solar cell photovoltage to the lower value needed to extract the photo-excited carrier with energy below the cell material band-gap $E_g$ will also allow the cell to periodically operate at a lower photovoltage value, which in turn enables a periodic increase in the carrier transport electric field value that enhances the carrier transport capability of the cell. This means that during the time interval when the cell photovoltage is lowered to enhance the carrier transport capability of the hot carrier solar cells 500, 700 and 900 of this invention, the lowered value of photovoltage is leveraged to provide the lower value of extraction energy at the cell contacts needed to extract the photo-excited carriers with energy below the cell material band-gap energy enabled by the quantum structures incorporated within the core solar cell of the hot carrier solar cell of this invention.

Optical Confinement Alternating Bias Hot Carrier Solar Cell

Figure 1:
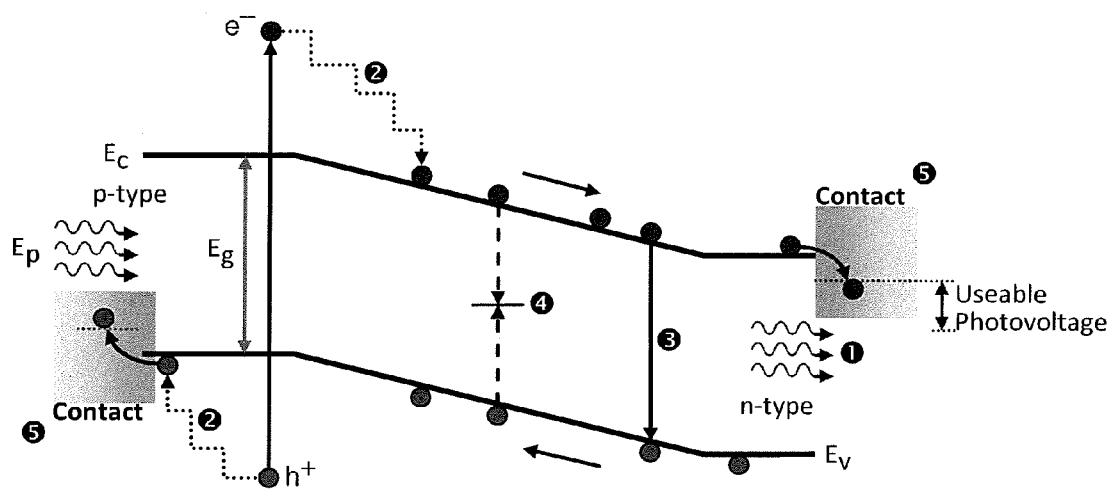
FIG. 1 illustrates the photovoltaic solar cell efficiency loss mechanisms.
Figure 2:
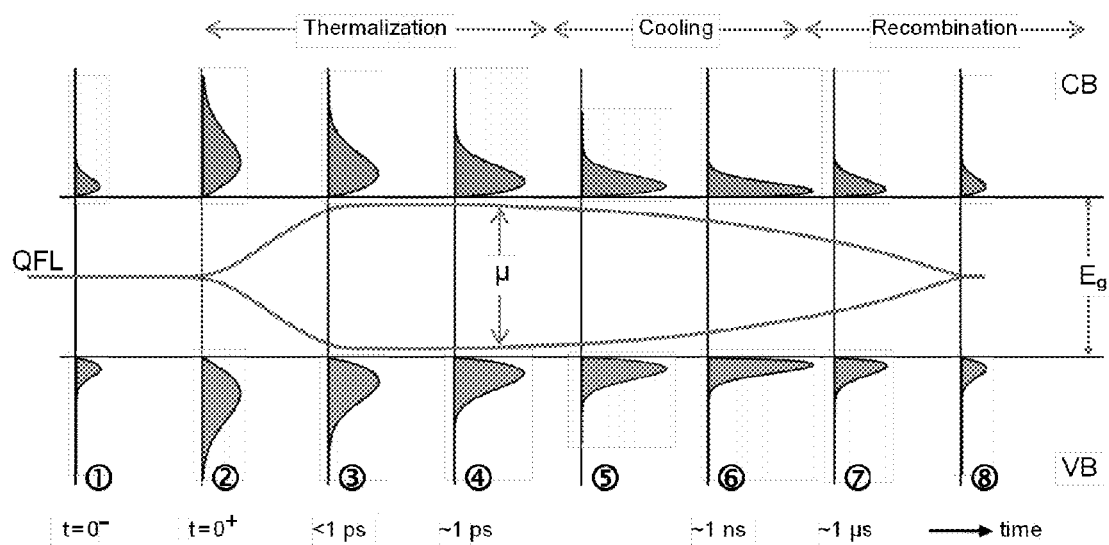
FIG. 2 illustrates the photovoltaic solar cell efficiency loss mechanisms.

As explained earlier, the contact-to-contact thickness of the core solar cell 530 used in the hot carrier solar cell embodiments 500, 700 and 900 significantly affects the carrier transport time, and consequently the performance of the alternating bias hot carrier solar cells of this invention. For example, even though the carrier lifetime characteristics in Si are typically much longer than III-V materials, as explained earlier, for silicon based core solar cell 530, a carrier transport time that ranges from ~1.5 ns to ~15 ns can be achieved by the hot carrier solar cells 900 and 500. These values are the high end of the carrier cooling phase of the carrier lifetime illustrated in FIG. 2. As a result, the benefits of the alternating bias hot carrier extraction scheme of this invention may not be fully realized in solar cells with a large contact-to-contact thickness, such as conventional Si solar cells. However, for cost reduction reasons, there is an intensive ongoing activity aimed at reducing the Si-based solar cell thickness; a trend that will also allow the benefits of the alternating bias hot carrier extraction scheme of this invention to be fully realizable in such cells. For example, the texturing of the cell top surface plus the placement of a reflective surface at the back side of a Si-based solar cell will cause multiple reflections of the light that enters the cell absorber, which will in turn allow the solar photons incident on the cell to be absorbed with a much thinner cell absorber. This simple light trapping means can cause a 20 µm thick Si solar cell to have even better light absorptance than a 400 µm Si solar cell ("Physics of Solar Cells", P. Würfel, pp. 173-177).

Figure 11A:
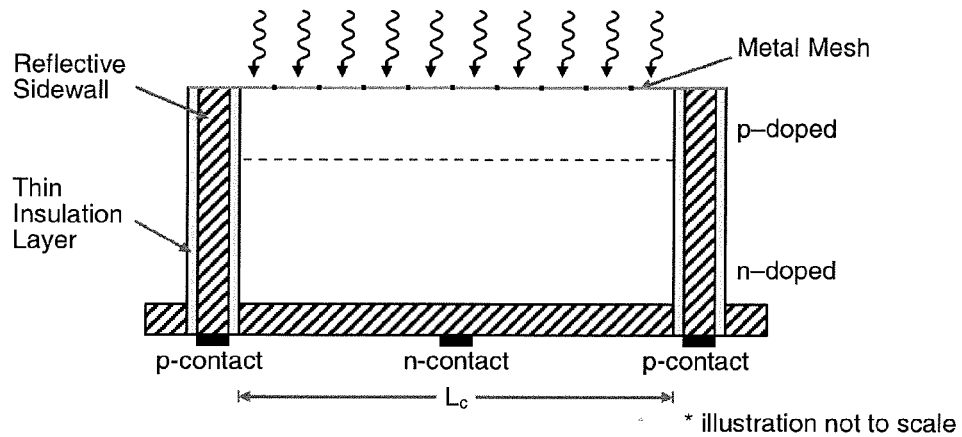
FIG. 11A illustrates a cross sectional view of the core solar cell of the hot carrier solar cell of this invention that incorporates optical confinement means.

A light confinement solar cell structure that leverages light trapping aspects similar to those referenced earlier plus the buried contacts ("The Physics of Solar Cells", J. Nelson, pp. 188-191) is illustrated in FIG. 11A. As illustrated in FIG. 11A, such a cell structure would incorporate reflective vertical sidewalls that divide the overall cell into multiple sub-cells each typically would be of width $L_c$ on the order of a few tens of microns. These sidewalls would serve multiple purposes. First, the sidewalls would be used to create multiplicity of optical micro cavities across the entire cell. These micro cavities would provide optical confinement of the incident solar photons that did not cause photo-excitation of carriers during their first pass, as well as photons generated within the cell structure due to radiative-recombination of photo-excited carriers. Second, as illustrated in FIG. 11A, the sidewalls would also serve as buried contact rails that would be interconnected to a micro mesh at the top surface of the cell. As illustrated in FIG. 11A, the micro mesh would have orthogonal pitch on the order of a few microns and would span the entire topside surface of the sub-cell in order to provide uniform distribution of applied bias as well as uniform contact for the extraction of the cell power output without significant blocking of the light incident of the cell top surface.

The optical confinement achieved by the reflective micro cavity sub-cells sidewalls, backside and texture topside of the micro cavity illustrated in FIG. 11A would result in the light that enters the sub-cell, reflecting as many as 4-6 times before decaying due to the absorptance of the micro cavity sub-cell sidewalls and backside. When the distance between micro cavity sub-cell sidewalls is $L_c$~50 µm, the created light confinement capability of the micro cavity sub-cell structure illustrated in FIG. 11A would make it possible to achieve contact-to-contact thickness of ~5 µm for a Si-based solar cell that incorporates the optical confinement micro cavity illustrated in FIG. 11A. As explained earlier, this contact-to-contact thickness will enable a carrier extraction time of ~0.25 ns, which is well within the expected carrier cooling time for silicon cells. When the light confining cell structure illustrated in FIG. 11A is used as the structure of the core cell 530 in the configurations 500, 700 and 900 of the hot carrier solar cells of this invention, it would allow these cells to operate at shorter carrier transport times. In addition it would also facilitate carrier photo-excitation by photons that would be generated by radiative recombination of photo-excited carriers—in a typical solar cell, these photons are lost due to efficiency loss mechanism ❸ explained earlier because they are not confined within such cell structures.

Figure 11B:
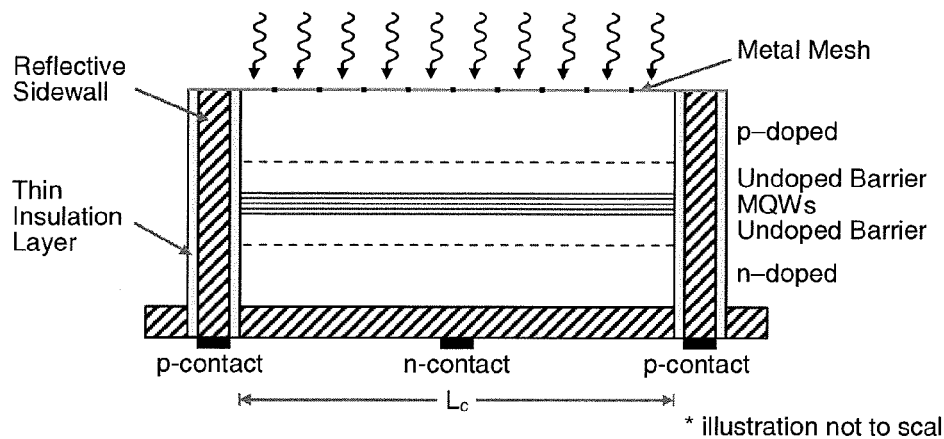
FIG. 11B illustrates a cross sectional view of the core solar cell of the hot carrier solar cell of this invention that incorporates both optical and quantum confinement means.

It is worth mentioning that the combination of the optical confinement provided by the cell structure incorporating the optical confinement micro cavity of FIG. 11A and the carrier quantum confinement provided by the cell material structure of FIG. 10A, when used collectively as illustrated in FIG. 11B within the context of the core solar cell 530 of the alternating bias solar cells 500, 700 and 900, would contribute to increasing the probabilities of carrier excitation by photons that did not cause carrier excitation in the first pass through. The possibility that the photons generated by the radiative recombination would cause subsequent excitation of carriers(s) can be greatly enhanced by the prolonged lifetime of the generated photon due to the optical confinement of the sub-cell micro cavity as well as the carrier confinement effect of the MQWs. Thus, the combination of photons and carrier confinement aspects of FIG. 11B would in effect enhance the chances that one solar photon would cause the excitation of multiple carriers—an effect that would circumvent one of the key assumptions of the efficiency limit established by the SQ-Model discussed earlier; namely, that a solar incident photon is assumed to produce only one electron-hole pair.

In reference to the earlier discussion on the loss mechanisms in solar cells, the hot carrier solar cells of this invention would be able to achieve a yielded net efficiency increase by circumventing loss mechanisms: ❶ the loss of photons with $E_p<E_g$, loss mechanism, ❷ the loss due to hot carrier relaxation, ❸ the loss of photo-excited carriers due to radiative recombination, and ❺ the loss due to contact extraction efficiency. Furthermore, the hot carrier solar cells of this invention would altogether avoid loss mechanism ❹ because it would be able to achieve efficiency comparable to that of a monolithic multi-junction cell with a single junction cell structure, thus avoiding the lattice matching issue that invokes that loss mechanism.

Based on the above discussion, the alternating bias hot carrier solar cells of this invention possibly incorporating quantum confinement structures such as QWs or QDs and photonic micro cavity sub-cells would be able to:

1. Convert into power the energy of incident solar photons having energies at, above and below the cell material band-gap $E_g$;
2. Harness the energy associated with internal photoemission caused by radiative re-combination of photo-excited carriers by re-cycling the emitted photons which otherwise will be lost;
3. Achieve multiple carrier-pair excitation by a single incident solar photon;
4. Enable the extraction of photo-excited carriers from cell structure that incorporate multiple QFLs separation; and
5. Operate in an alternating output mode that eliminates the AC/DC inverter loss;

Candidate Material Systems

Figure 12:
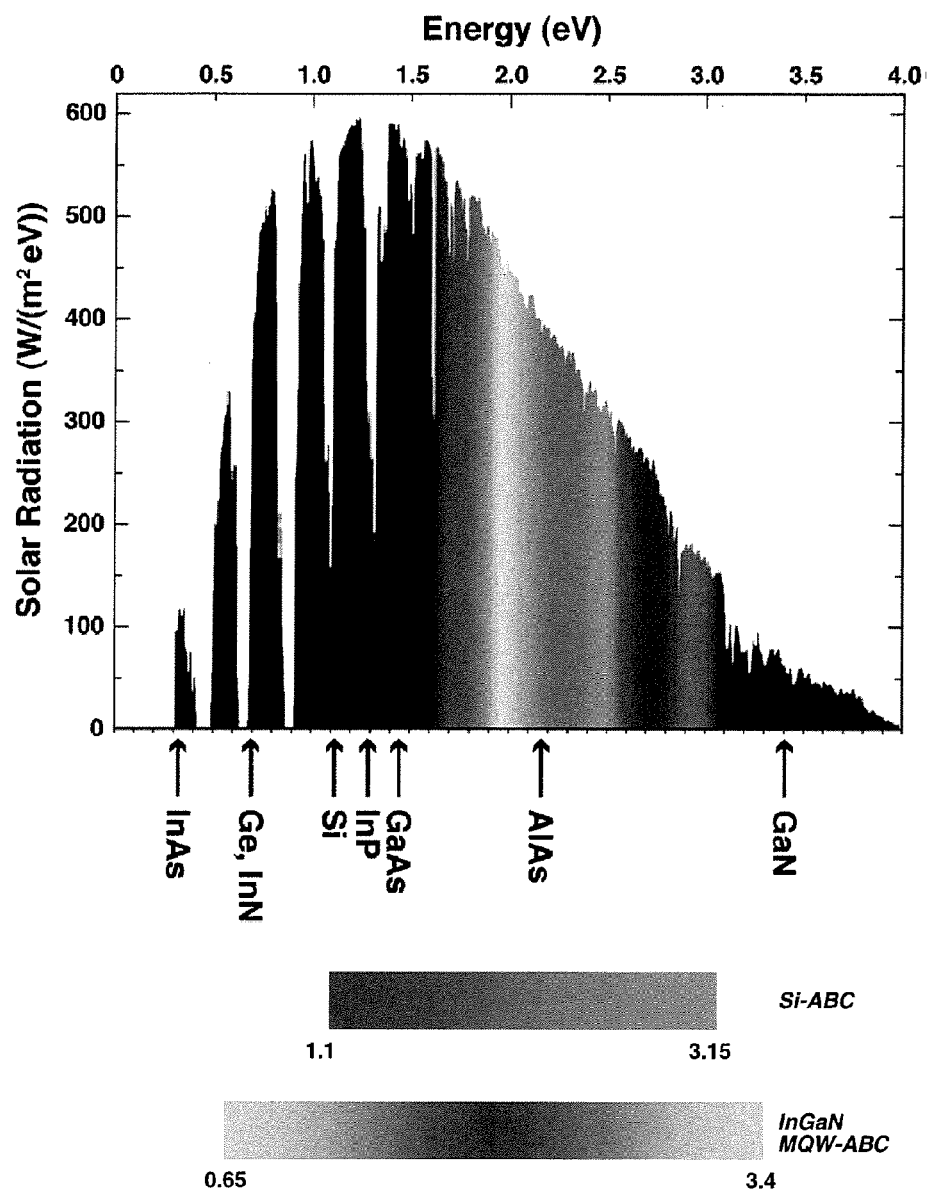
FIG. 12 illustrates the candidate material systems for the alternating hot carrier solar cells of this invention.

As explained earlier, the alternating bias hot carrier solar cells of this invention can be implemented in conjunction with conventional bulk material solar cell materials, such as conventional Si, CdTe, CIGS, as well as III-V materials such as bulk GaAs and solar cells incorporating quantum confinement such as QWs and QDs. FIG. 12 (adapted from "Third Generation Photovoltaics", Gregory F. Brown and Junqiao Wu, Laser & Photon Rev., 1-12 (2009), published online: 2 Feb. 2009) shows the band-gap energy of several candidate solar cell material systems that can be used in conjunction with the alternating bias hot carrier solar cells of this invention in reference to the energy distribution of the solar spectrum. As shown in FIG. 12, today's most efficient single junction solar cells, including those based on Si, InP and GaAs, have band-gap energies between 1.1 eV and 1.4 eV and can typically convert into energy only a relatively narrow band of the solar photons across the solar energy spectrum. This narrow coverage of the solar energy spectrum is fundamentally what is limiting today's single junction photovoltaic solar cell efficiency below 30% under 1-sun. In practice, the yielded net efficiency is even lower due to implementation losses, a large portion of which is the 25% DC-to-AC inverter loss, which makes the yielded net efficiency of a typical single junction solar cell module become well below 20%. In practice, the best efficiency single junction Si-cell achieves less than 24% efficiency, not counting the DC-to-AC inverter loss, which when taken into account would result in 18% yielded net efficiency from the cell. In comparison, the alternating bias hot carrier solar cells of this invention could have a solar photon energy coverage that would extend from 0.65 eV to 3.15 eV, thus covering a large portion of the solar spectrum and yielding a net efficiency level that is multifold higher than 18%.

The solar energy spectrum coverage of two candidates alternating bias hot carrier solar cells is illustrated in FIG. 12. The first candidate being Si-based, designated in FIG. 12 as Si-ABC, uses either a conventional Si solar cell or the thin-Si solar cell described in FIG. 11A that incorporates optical confinement micro cavities. The second candidate is based on using a $In_xGa_{1-x}N$ material system that incorporates the graded MQWs, designated in FIG. 12 as InGaN MQW-ABC. With the alternating bias hot carrier extraction scheme of this invention, it would be possible to extend the Si-based solar cell spectrum coverage to have it span from the Si band-gap energy of 1.1 eV to almost 3 eV, thus enabling overall power conversion efficiency that could be more than 2.5× of a conventional Si-cell. With the typical yielded power retail cost of 0.35 $/kWh of today's high efficiency Si-based solar cells ("Solar Photovoltaics: Expanding Electric Generation Options", Electric Power Research Institute (EPRL), December 2007) and in taking into account cost increase due to the components added to implement the alternating bias scheme of this invention, the efficiency increase that can be achieved by a Si-based alternation bias solar cell would yield a retail cost of solar power of less than 0.15$/kWh, which is less than half the retail cost of power achieved by today's Si-cell and is well within the range of today's conventional power retail cost.

An indium gallium nitride ($In_xGa_{1-x}N$) material system has a band-gap energy that spans from 0.65 eV to 3.4 eV, making it an almost perfect match to the solar spectrum. The full potential solar coverage of this material system can be achieved by a MQW-based $In_xGa_{1-x}N$ alternating bias hot carrier solar cell described earlier. The graded MQW of FIG. 10A can be realized in conjunction with using ($In_xGa_{1-x}N$) material by varying the value of the indium incorporation "x" across the multiple quantum wells from a low to a high value to create a multiplicity of quantum wells having a band-gap that spans across the band-gap of gallium nitride (GaN). With the proper design of the intermediate band of a MQW-based $In_xGa_{1-x}N$ material, the $In_xGa_{1-x}N$ material can be made to realize a band-gap that extends from almost 0.65 eV to 3.4 eV. This type of material system, when used in conjunction with the alternating bias scheme of this invention, would be able to achieve almost full coverage of the solar spectrum, making it possible to achieve ultra high efficiency from a single junction solar cell, especially when used in conjunction with a solar concentrator. As explained earlier, with such a cell output power being already an alternating current, most of the achieved efficiency can be harnessed to provide the potential of achieving higher than 70% yielded net efficiency after taking into account other implementation losses. At this level of yielded net efficiency and an estimated cost $W_p$ of 2.25 $/W, the $In_xGa_{1-x}N$ MQW alternating bias hot carrier solar cell operating in conjunction with a 100× solar concentrator would have the potential of achieving a retail cost of solar power of less than 0.10$/kWh—which is less than a third of the retail cost of power achieved by today's most efficient conventional solar cells and is also well within the range of today's conventional power retail cost.

As explained above, the two examples of applications of the alternating bias scheme in bulk Si-cell and MQW-based III-V solar cell described in this disclosure show a predicted multifold reduction in the retail cost of the power generated by the cell, which indicates that the alternating current hot carrier solar cell of this invention could lead to attainment of the $3^{rd}$ Generation (3G) solar cells cost goals.

Performance Comparison

Table 1 is a tabulation of the achieved efficiency of the most currently used solar cells together with the predicted yielded net efficiency (or power added efficiency, PAE) of the two example applications of the alternating bias hot carrier solar cell discussed earlier; namely, the Si-based cell operating under 1-sun and the $In_xGa_{1-x}N$ MQW based cell operating with a 100× solar concentrator (100-sun). In order to put the comparison of Table 1 into perspective, it should be noted that the listed achieved efficiency of the current solar cells does not reflect the estimated 25% loss caused by the DC-to-AC converter needed at their output. On the other hand, since the alternating bias hot carrier cells power output is AC, the predicted efficiency performance of the two alternating current cells listed in Table 1 is the yielded net efficiency at the system level after accounting for possible implementation losses. Therefore, for meaningful one-to-one comparison the efficiency performance values of the current solar cell should be decremented by 25%.

Table 1 highlights the theme carried throughout this disclosure that solar cells implemented using the described alternating bias scheme of this invention could achieve multifold increases in efficiencies achieved by current single junction cells. Furthermore, Table 1 also highlights that, depending on the selected material system, the quantum confinement structure based, either Qws or QDs, has the potential of achieving a yielded net efficiency that is comparable or possibly higher than multi-junction solar cells. When realized, the cost/efficiency benefits of achieving this level of yielded net efficiency could very possibly launch the solar cell industry in its way toward achieving the set 3G objectives.

CONCLUSION

This disclosure describes novel design approaches for achieving extremely high efficiency in solar cells. First, a novel alternating bias scheme was described that enhances the photovoltaic power extraction capability above the cell band-gap by enabling the extraction of hot carriers. When applied in conjunction with bulk material single junction solar cells, the described alternating bias hot carrier cells has the potential of more than doubling its core cell yielded net efficiency. Second, when the alternating bias scheme is applied in conjunction with quantum wells (QWs) or quantum dots (QDs) based solar cells, the alternating bias hot carrier solar cells of this invention have the potential of extending their core solar cell power extraction coverage across the entire solar spectrum, thus enabling the attainment of an unprecedented level of solar power extraction efficiency. Third, when the alternating bias scheme is applied in conjunction with core solar cells incorporating both quantum and photonic confinement, the resultant solar cells can potentially circumvent most all of the loss mechanisms that limit the efficiency of today's solar cells. This is achieved by combining the hot carrier extraction capability of the described alternating bias scheme with a novel cell design that incorporates graded MQWs to extend the cell photovoltaic power extraction capability below the cell band-gap and sub-cell photonic confinement micro cavities to harness the carriers radiative recombination and to enable the generation of multiple carriers per single absorbed photon, thus further enhancing the cell efficiency.

Thus the present invention has a number of aspects, which aspects may be practiced alone or in various combinations or sub-combinations, as desired. While preferred embodiments of the present invention have been disclosed and described herein for purposes of illustration and not for purposes of limitation, it will be understood by those skilled in the art that various changes in form and detail may be made therein without departing from the spirit and scope of the invention.

In the forgoing detailed description, the present invention has been described with reference to specific embodiments thereof. It will, however, be evident that various modifications and changes can be made thereto without departing

TABLE 1

Comparison of the efficiency predictions of alternating current hot carrier cells of this invention and conventional solar cells.

| | Approximate Theoretical Efficiency Limit | Experimental & Predicted Performance | |
|---|---|---|---|
| Thermodynamic (max concentration) | 87% | — | |
| Single-junction (100 suns) | 33% | 65+% | MQW-based III-V Alternating Bias Hot Carrier cell[2] |
| Thermodynamic (1 sun) | 68% | — | |
| Six-junction | 59% | — | |
| Single-junction (1 sun) | 33% | 45+% | Alternating Bias Hot Carrier cell[2] |
| Triple-junction concentrator | 64% | 44% | III-V alloys, monolithic stack[1] |
| Double-junction concentrator | 56% | 30% | III-V alloys, monolithic stack[1] |
| Triple-junction (1 sun) | 51% | 15% | Thin-film amorphous silicon alloys[1] |
| Double-junction (1 sun) | 45% | 12% | Thin-film amorphous silicon alloys[1] |
| Shockley-Queisser Single-junction (1 sun) | 33% | 24% | Crystalline silicon |
| | | 20% | Thin multi-crystalline silicon |
| | | 12% | Dye-sensitized cell |
| | | 6% | Organic cell |

[1]DC/AC Inverter Loss Not Included
[2]No DC/AC Inverter Needed from the broader spirit and scope of the invention. The design details and drawings are, accordingly, to be regarded in an illustrative rather than a restrictive sense. Skilled persons will recognize that portions of this invention may be implemented differently than the implementation described above for the preferred embodiment. For example, skilled persons will appreciate that the serial and parallel bias circuits of the alternating bias hot carrier solar cells of this invention can be implemented with numerous variations and that the specific design parameters of these bias circuits can substantially vary the characteristics of the alternating bias and consequently the performance of the resultant solar cell. Skilled persons will further recognize that many changes may be made to the details of the aforementioned embodiments of this invention without departing from the underlying principles and teachings thereof. The scope of the present invention should, therefore, be determined only by the following claims.

What is claimed is:

1. A method of operating a solar cell comprising:
    providing a solar cell having first and second contacts and a single junction coupled between the first and second contacts;
    causing a varying load on the first and second contacts during operation of the solar cell;
    the varying load causing a voltage difference between the first and second contacts to alternate between minimum and maximum solar cell voltages, the maximum and minimum solar cell voltages both being of a same polarity;
    a period of alternation between the minimum and the maximum solar cell voltages being shorter than a hot carrier cooling time for the solar cell to extract from the solar cell, photo-excited carriers across a range of energy levels.

2. The method of claim 1 wherein the solar cell is a bulk material solar cell.

3. The method of claim 1 wherein the solar cell incorporates quantum confinement.

4. The method of claim 1 wherein:
    the minimum solar cell voltage is a solar cell voltage at which a solar cell built-in potential is sufficiently high to cause acceleration of photo-excited carriers within the solar cell toward the first and second contacts of the solar cell with a transport velocity approaching or reaching their maximum transport velocity; and
    the maximum solar cell voltage being substantially equal to a maximum electrochemical potential of the photo-excited carriers generated within the solar cell.

5. The method of claim 1 wherein the solar cell is first operated before the varying load causes a voltage difference between the first and second contacts to alternate between minimum and maximum solar cell voltages to provide power to circuitry causing the varying load across the first and second contacts to then cause the voltage difference between the first and second contacts to alternate between minimum and maximum solar cell voltages.

6. The method of claim 1 wherein a sub-period during which the solar cell voltage approaches or reaches the minimum solar cell voltage is selected to be short enough to maintain an average photovoltage between the first and second contacts at or near the highest possible voltage.

7. The method of claim 1 wherein a sub-period during which the solar cell voltage approaches or reaches the minimum solar cell voltage is selected to be long enough to sustain an average carrier transport velocity to transport substantially all of the photo-excited carriers within the solar cell to the first and second contacts of the solar cell within the hot carrier cooling time.

8. The method of claim 7 wherein the period of alternation between the minimum and the maximum solar cell voltages and a ratio of the duration of the sub-period to the alternation period being selected responsive to band-gap, carrier mobility and crystal lattice characteristics of the solar cell.

9. The method of claim 1 wherein the alternation is interrupted for at least one time interval, shorter than the period of alternation, during which the solar cell voltage is caused to be of an opposite polarity for a duration and period of repetition to sustain an average carrier transport velocity sufficient to transport substantially all of the photo-excited carriers within the solar cell to the first and second contacts within the hot carrier cooling time.

10. The method of claim 9 wherein a sub-period during which the solar cell voltage approaches or reaches the minimum solar cell voltage is selected to be long enough to sustain an average carrier transport velocity to transport substantially all of the photo-excited carriers within the solar cell to the first and second contacts of the solar cell within the hot carrier cooling time, the sub-period during which the solar cell voltage approaches or reaches the minimum solar cell voltage is also selected to be short enough to keep an average photovoltage achieved by the solar cell at the highest possible photovoltage, and the period of alternation between the minimum and the maximum solar cell voltages and a ratio of the duration of the sub-periods to the alternation period being selected responsive to band-gap, carrier mobility and crystal lattice characteristics of the solar cell, allowing extraction energy separation between the first and second solar cell contacts to temporally sweep through a range of extraction energies that substantially matches a profile of the electrochemical potential of the photo-excited carriers within the solar cell, thus allowing a single junction solar cell to have energy extraction efficiency benefits of a multi junction solar cell.

11. The method of claim 9 wherein a sub-period during which the solar cell voltage approaches or reaches the minimum solar cell voltage is selected to be long enough to sustain an average carrier transport velocity to transport substantially all of the photo-excited carriers within the solar cell to the first and second contacts of the solar cell within the hot carrier cooling time, the sub-period during which the solar cell voltage approaches or reaches the minimum solar cell voltage is selected to be short enough to keep an average photovoltage achieved by the solar cell at or near a highest possible average photovoltage, and the period of alternation between the minimum and the maximum solar cell voltages and a ratios of the duration of the sub-periods to the alternation period being selected responsive to band-gap, carrier mobility and crystal lattice characteristics of the solar cell, thereby providing extraction energy separation between the first and second solar cell contacts to temporally sweep through a wide range of extraction energies at a rate that is comparable to or faster than the hot carrier cooling time, allowing the photo-excited carriers that reach the first and second solar cell contacts to be transferred to a solar cell load through a temporally discrete narrow extraction energy band at each of the first and second contacts and with instantaneous energy separation between the first and second contacts that substantially equals the energy separation between the photo-excited carriers within the solar cell.

12. The method of claim 11 wherein:
    solar cell materials are selected from a group consisting of silicon (Si), gallium arsenide (GaAs), cadmium telluride (CdTe), copper indium diselenide (CIS), copper indium gallium diselenide (CIGS), and alloys of III-V materials; and the period of alternation enables the temporally discrete narrow extraction energy which allows the photo-excited carriers to be extracted from the solar cell before cooling down within the solar cell materials or the first and second contacts.

13. The method of claim 11 wherein solar cell materials are selected from the group consisting of silicon (Si), gallium arsenide (GaAs), cadmium telluride (CdTe), copper indium diselenide (CIS), copper indium gallium diselenide (CIGS), and alloys of III-V materials.

14. The method of claim 13 wherein the alternation of the solar cell voltage between the minimum and maximum solar cell voltages extracts photo-excited carriers within the solar cell over a range of extraction energies that substantially matches an energy profile of the photo-excited carriers generated within the solar cell that spans from a band-gap energy of the solar cell materials to an energy that is substantially equal to a maximum of an electrochemical potential of the hot carriers to be extracted from the solar cell.

15. The method of claim 13 wherein the solar cell comprises either quantum confinement structures or optical confinement structures or both.

16. The method of claim 15 wherein the alternation of the solar cell voltage between the minimum and maximum solar cell voltages extracts carriers within the solar cell that were photo-excited by solar photons having energy that extends over a range of energies extending from a band-gap energy of the solar cell materials to an energy that is substantially equal to a maximum of an electrochemical potential of the photo-excited carriers to be extracted from the solar cell.

17. The method of claim 15 wherein the alternation of the solar cell voltage provides the extraction of photo-excited carriers within the solar cell over a range of extraction energies that substantially matches an energy profile of the photo-excited carriers generated within the solar cell spanning from substantially below a band-gap energy of the solar cell materials to an energy that is substantially equal to a maximum of an electrochemical potential of the photo-excited carriers to be extracted from the solar cell.

18. The method of claim 15 wherein the alternation of the solar cell voltage causes the extraction of photo-excited carriers within the solar cell photo-excited by solar photons having energies that extend over a wide range of energies from substantially below a band-gap energy of the solar cell materials to an energy that is substantially equal to a maximum of an electrochemical potential of the photo-excited carriers to be extracted from the solar cell.

19. The method of claim 15 wherein the solar cell comprises quantum confinement structures comprised of quantum wells or quantum dots.

20. The method of claim 19 wherein the quantum confinement structures comprise multiple quantum wells wherein the band-gap of the multiple quantum wells is graded to provide a range of different band-gap values for the quantum wells, with the range of different band-gap values being below the solar cell material band-gap value.

21. The method of claim 1 further comprising pulling the maximum solar cell voltage above an open circuit voltage of the solar cell.

22. The method of claim 1 wherein causing the varying load on the first and second contacts comprises causing a non-dissipative varying load on the first and second contacts.

23. The method of claim 1 further comprising pulling the maximum solar cell voltage above an open circuit voltage of the solar cell, and wherein causing the varying load on the first and second contacts comprises causing a non-dissipative varying load on the first and second contacts.

24. The method of claim 1 wherein the alternation of the minimum and maximum solar cell voltages is interrupted for at least one time interval, shorter than the period of alternation, during which the solar cell voltage is caused to be driven to an opposite polarity.

\* \* \* \* \*